(12) United States Patent
Oikawa

(10) Patent No.: US 9,157,969 B2
(45) Date of Patent: Oct. 13, 2015

(54) MAGNETIC ELEMENT CONTROL DEVICE, MAGNETIC DEVICE CONTROL METHOD, AND MAGNETIC DETECTING DEVICE

(71) Applicant: FUJIKURA LTD., Tokyo (JP)

(72) Inventor: Yasushi Oikawa, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/540,590

(22) Filed: Nov. 13, 2014

(65) Prior Publication Data

US 2015/0070010 A1 Mar. 12, 2015

Related U.S. Application Data

(63) Continuation of application No. PCT/JP2013/063577, filed on May 15, 2013.

(30) Foreign Application Priority Data

May 15, 2012 (JP) ................................. 2012-111670

(51) Int. Cl.
*G01R 33/02* (2006.01)
*G01R 33/04* (2006.01)
*G01R 33/06* (2006.01)

(52) U.S. Cl.
CPC .............. *G01R 33/063* (2013.01); *G01R 33/04* (2013.01)

(58) Field of Classification Search
CPC ..................................................... G01R 33/028
USPC ................................................. 324/253, 258
See application file for complete search history.

(56) References Cited

U.S. PATENT DOCUMENTS 4,300,095 A 11/1981 Rhodes
7,391,211 B2 6/2008 Cripe

FOREIGN PATENT DOCUMENTS

| CN | 201819983 U | 5/2011 |
| CN | 201886139 U | 6/2011 |
| CN | 202126492 U | 1/2012 |
| JP | 2007-078422 A | 3/2007 |
| JP | 2007-078423 A | 3/2007 |
| JP | 2007-163424 A | 6/2007 |
| JP | 2008-292325 A | 12/2008 |
| JP | 2012-145414 A | 8/2012 |

OTHER PUBLICATIONS

International Search Report for PCT/JP2013/063577 dated Aug. 27, 2013.
Communication dated Jul. 7, 2015, issued by the State Intellectual Property Office of the People's Republic of China in counterpart Application No. 201380024770.3.

*Primary Examiner* — Bot Ledynh
(74) *Attorney, Agent, or Firm* — Sughrue Mion, PLLC

(57) ABSTRACT

A magnetic element control device controls a magnetic element during detection of an intensity of a stationary magnetic field by a time-resolved magnetic balance system where the magnetic field is applied to a flux-gate magnetic element that is constituted of an excitation coil and a detecting coil. The magnetic element control device includes: an excitation signal generator; an excitation signal adjuster; a detection signal comparator; a feedback signal converter; a feedback signal adjuster; and a data signal converter. The excitation signal adjuster superimposes a feedback signal on an alternating voltage signal and thereby generates an excitation signal, and applies the generated excitation signal to the excitation coil.

10 Claims, 14 Drawing Sheets

MAGNETIC ELEMENT CONTROL DEVICE, MAGNETIC DEVICE CONTROL METHOD, AND MAGNETIC DETECTING DEVICE

CROSS REFERENCE TO RELATED APPLICATIONS

This application is a continuation application based on a PCT Patent Application No. PCT/JP2013/063577, filed May 15, 2013, whose priority is claimed on Japanese Patent Application No. 2012-111670 filed on May 15, 2012, the content of which is hereby incorporated by reference.

BACKGROUND OF THE INVENTION

The present invention relates to a signal processing circuit, a physical quantity measurement device using a signal processing circuit, particularly, a magnetic element control device that drives a magnetic element utilizing a time-resolved flux gate system (hereinbelow, referred to as FG system), a magnetic device control method, and a magnetic detecting device that detects a magnetic field by use of the magnetic device control method.

DESCRIPTION OF THE RELATED ART

Generally, since a magnetic element used in a FG system has a magnetic field detection sensitivity which is greater than that of a hall device serving as a similar magnetic element that detects a magnetic field or a magneto resistive device and can be reduced in size, it is used in an azimuth detecting device such as a portable electronic device.

FIG. 10 is a view showing a configuration example of a magnetic element utilizing a time-resolved FG system (magnetic proportion measurement system).

As shown in FIG. 10, a magnetic element used in a FG system includes an excitation winding and a detecting winding which are wound around an outer peripheral face of a magnetic core formed of a high permeability material.

The region around which the excitation winding is wound serves as an excitation coil and is driven by an excitation signal; and the region around which the detecting winding is wound serves as a detecting coil and outputs a detection signal.

FIG. 11 shows a waveform chart showing the principle of magnetic field detection in a magnetic proportion system by use of a magnetic element utilizing a time-resolved FG system.

PART (a) of FIG. 11 shows an excitation current that is supplied to an excitation coil of a magnetic element, the axis of ordinate represents a current value of the excitation current, and the axis of abscissas represents time.

PART (b) of FIG. 11 shows a magnetic flux density of a magnetic field that is generated in a magnetic core by the excitation coil of the magnetic element, the axis of ordinate represents the magnetic flux density thereof, and the axis of abscissas represents time.

PART (c) of FIG. 11 shows a voltage value of pulse generated by an induced electromotive force by a detecting coil of a magnetic element, and the axis of abscissas represents time.

In FIG. 11, in order to drive the excitation coil, a signal of the excitation current Id (hereinbelow, referred to as an excitation signal), which serves as an excitation signal of an electrical current alternating at a constant frequency, i.e., an excitation signal having a triangular wave as shown in PART (b) of FIG. 11 (that is, a triangular wave current signal), is applied between terminals TI1 and TI2 of the excitation coil.

Consequently, in the time in which a direction of the excitation current is changed (a period of time in which a positive excitation current and a negative excitation current alternate), in the case of PART (c) of FIG. 11, a positive pulse and a negative pulse are generated by an induced electromotive force by the detecting coil at time point t1 and time point t2, and the pulsed voltage Vp is referred to as a detection signal.

The detection signal forms continuous voltage pulses having a positive and a negative polarity so as to correspond to a period of the triangular wave current signal, and the detection signal is generated between the terminals of the detecting coil.

A stationary magnetic field Hex penetrates through a cylindrical space formed by an excitation winding and a detecting winding of the magnetic core. In the case where the stationary magnetic field Hex is applied to the magnetic element, a steady-state current corresponding to the stationary magnetic field flows in the excitation winding.

That is, the above-described steady-state current as offset current is superimposed on the excitation current Id of the excitation signal applied to the excitation winding.

As a result of the offset, a driving state of the excitation coil due to an alternate excitation signal varies, that is, the time point at which a flow direction of the excitation current Id is changed varies in the case where the stationary magnetic field Hex is applied thereto or in the case where the stationary magnetic field Hex is not applied thereto.

At this time, as shown in PART (a) of FIG. 11, as compared with the case where the stationary magnetic field Hex is not applied (Hex=0), in the case where the stationary magnetic field Hex is applied in the same direction as that of the magnetic field generated by the excitation coil (Hex>0), the position of the axis of abscissas L1 in which the flow direction of the excitation current Id varies is changed to that of the axis of abscissas L2.

On the other hand, as compared with the case where the stationary magnetic field Hex is not applied, in the case where the stationary magnetic field Hex is applied in the direction opposite to the magnetic field generated by the excitation coil (Hex<0), the position of the axis of abscissas L1 in which the flow direction of the excitation current Id varies is changed to that of the axis of abscissas L2.

Accordingly, a variation in the magnetic flux density φ in the magnetic core, which is changed depending on the timing at which the flow direction of the excitation current Id varies, is also changed depending on a steady-state current superimposed on the excitation current Id.

Consequently, when there is a variation in the direction of magnetic flux, an induced electromotive force is generated in the detecting coil in a direction which cancels variation in the magnetic flux, that is, a detection signal is generated as a negative voltage pulse at the timing at which the excitation current Id is changed from positive to negative.

On the other hand, a detection signal is generated as a positive voltage pulse at the timing at which the excitation current Id changes from negative to positive.

Accordingly, the FG type magnetic element compares the timing of outputting a detection signal in the case where a steady-state current Hex is not applied thereto to the timing of outputting a detection signal in the case where the steady-state current Hex is applied thereto, and can thereby indirectly measure the magnitude of the stationary magnetic field Hex.

This means that, in the case where the stationary magnetic field Hex is applied, since a specified steady-state current flows to a drive coil, a fixed offset is superimposed on the excitation signal, the time interval between pulsed detection signals of a negative voltage and a positive voltage varies.

For this reason, a magnetic field detection device using the FG type magnetic element measures the time interval between the generated pulsed detection signals of the negative voltage and the positive voltage and thereby measures the intensity of the stationary magnetic field Flex applied from the exterior thereof (for example, Japanese Unexamined Patent Application, First Publication No. 2008-292325 (hereinbelow, referred to as Patent Document 1), Japanese Unexamined Patent Application, First Publication No. 2007-078423 (hereinbelow, referred to as Patent Document 2), and Japanese Unexamined Patent Application, First Publication No. 2007-078422 (hereinbelow, referred to as Patent Document 3).

Here, the maximum value of the excitation current Id applied to the excitation coil is set to a value such that a magnetic field is greater than or equal to a saturated magnetic flux density of the magnetic core.

Accordingly, a measurement range of a magnetic field is determined by the time length of one period of the excitation signal and by a time change (hereinbelow, refer to an excitation efficiency) corresponding to a value of a steady-state current that is an offset current which is due to application of the stationary magnetic field Hex.

That is, the time between t0 to t3 is one period of the excitation signal, the width of the period is the length of time T.

In the case where the stationary magnetic field Hex is not applied (Hex=0), a length of time from the time point t1 at which a detection signal of the negative voltage (hereinbelow, refer to a first detection signal) is output to the time point t2 at which a detection signal of the positive voltage (hereinbelow, refer to a second detection signal) is detected is a half period of the excitation signal, that is, a time length of T/2.

Moreover, in the case where the stationary magnetic field Hex is applied, a duration (hereinbelow, refer to a measurement duration) which is from the time at which the first detection signal is output to the time at which the second detection signal is detected varies with respect to the time length T/2.

Here, as shown in FIG. 11, in the case where a magnetic flux direction of the stationary magnetic field Flex is represented by the arrow denoted by a solid line (Hex>0), since the direction is the same as that of the magnetic flux generated by the excitation coil, the duration Tm becomes shorter than the time length T/2 (T0>Tm).

On the other hand, in the case where a magnetic flux direction of the stationary magnetic field Hex is represented by the arrow denoted by a broken line (Hex<0), since the direction is opposite to that of the magnetic flux generated by the excitation coil, the duration Tp becomes longer than the time length T/2 (Tp>T0).

Here, T0=T/2.

Next, FIG. 12 is a view showing a configuration example of a magnetic element utilizing a time-resolved FG system (magnetic field balance measurement).

As shown in FIG. 12, a magnetic element used in a FG system utilizing a magnetic field balance measurement is different from the magnetic element shown in FIG. 10 and has a feedback wire winding coil (hereinbelow, FB) in addition to an excitation winding and a detecting winding, which are wound around an outer peripheral face of a magnetic core formed of a high permeability material.

The region around which the excitation winding is wound serves as an excitation coil and is driven by an excitation signal; the region around which the detecting winding is wound serves as a detecting coil and outputs a detection signal; and the region around which the feedback winding is wound serves as a feedback coil and is driven by a feedback signal.

Next, FIG. 13 is a waveform chart showing the principle of magnetic field detection in a magnetic field balance system by use of a magnetic element utilizing a time-resolved FG system.

PART (a) of FIG. 13 shows an excitation current that is supplied to an excitation coil of a magnetic element, the axis of ordinate represents a current value of the excitation current, and the axis of abscissas represents time.

The excitation current is an alternating signal between the positive and the negative, and a reference current value of 0 A (zero amperes) is the boundary therebetween.

PART (b) of FIG. 13 shows an FB signal (particularly, a feedback signal) due to an electrical current that is applied to an FB coil of a magnetic element, the axis of ordinate represents a current value of the FB signal, and the axis of abscissas represents time.

PART (c) of FIG. 13 shows a voltage value of pulse generated by an induced electromotive force by a detecting coil of a magnetic element, and the axis of abscissas represents time.

As shown in FIG. 13, in the case of magnetic field balance measurement, a magnetic field that cancels a stationary magnetic field to be applied to a magnetic element (a stationary magnetic field which passes through the inside of the magnetic core) is generated by the above-described FB coil.

Consequently, based on the current value when the magnetic field that cancels the stationary magnetic field is generated in the FB coil, the stationary magnetic field that is applied to a magnetic element is measured.

In the magnetic field balance system, as a coil that generates a magnetic field for cancelling the stationary magnetic field in the magnetic core, the aforementioned FB coil in addition to an excitation coil and a detecting coil are provided on the magnetic element.

Hereinafter, in the description, a system that cancels the stationary magnetic field in the magnetic core by applying the FB signal thereto and carries out measurement of a magnetic field, is referred to as FB control using an FB coil.

Furthermore, in the case of magnetic field balance measurement, similar to the above-described magnetic proportion system, an time interval between the pulses generated by a detecting coil is measured in the period of time in which a positive excitation signal and a negative excitation signal alternate and are applied to an excitation coil.

Subsequently, the FB signal is applied to the FB coil so that a length of time from the time point t1 at which a detection signal of the measured negative voltage is output to the time point t2 at which a detection signal of the positive voltage is detected becomes T/2.

For example, as shown in PART (c) of FIG. 13, when the duration between the time point t1 and the time point t2 is wider than T/2, a stationary magnetic field in a negative direction is applied as shown in PART (a) of FIG. 13, and the curve line of the excitation signal is substantially changed from the curve line L0 to the curve line L2.

Consequently, in order to return the curve line L2 of the excitation signal to the position of the curve line L0 at which the duration between the time point t1 and the time point t2 becomes T/2, the FB signal having the current value represented by the line FB2 shown in PART (b) of FIG. 13 is applied to the FB coil.

In contrast, in PART (c) of FIG. 13, when the duration between the time point t1 and the time point t2 is narrower than T/2, a stationary magnetic field in a positive direction is applied as shown in PART (a) of FIG. 13, and the curve line of the excitation signal is substantially changed from the curve line L0 to the curve line L1.

Consequently, in order to return the curve line L1 of the excitation signal to the position of the curve line L0, the FB signal having the current value represented by the line FB1 shown in PART (b) of FIG. 13 is applied to the FB coil.

Next, an intensity of the stationary magnetic field applied to the magnetic element is calculated from a current value of the FB signal that is applied to the FB coil so that the duration between the time point t1 and the time point t2 becomes T/2.

Particularly, in the aforementioned explanation, the case where the axis of ordinate component in PART (a) of FIG. 13 is represented as an electrical current and an excitation signal applied to an excitation coil is represented as a current signal is described; however, the axis of ordinate component may be represented as a voltage value between both ends of terminals of the excitation coil.

In this case, in PART (a) of FIG. 13, the axis of ordinate which represents a voltage and intersects with the axis of abscissas is expressed as a standard reference voltage of Vref (electrical current of 0 A).

Next, FIG. 14 is a block diagram showing a configuration example of a magnetic detecting device by use of a magnetic element control device utilizing FB control using an FB coil.

As shown in FIG. 14, a magnetic element 100 includes a detecting coil, an excitation coil, and an FB coil.

A magnetic element control device 200 includes a magnetic device controller 201, a clock signal generator 202, and a clock signal adjuster 203.

The clock signal generator 202 generates a clock signal having a period T and outputs it to the clock signal adjuster 203.

The clock signal adjuster 203 adjusts a signal level of the supplied clock signal and outputs the adjusted clock signal to the magnetic device controller 201.

The magnetic device controller 201 includes a detection signal amplifier 2012, a detection signal comparator 2013, a feedback signal adjuster 2014, a feedback signal converter 2015, a data signal converter 2016, an excitation signal adjuster 2017, and an excitation signal generator 2018.

The excitation signal generator 2018 generates, from a clock signal supplied from the clock signal adjuster 203, a triangular wave serving as an excitation signal shown in PART (a) of FIG. 13.

The excitation signal adjuster 2017 adjusts the voltage level of the excitation signal supplied from the excitation signal generator 2018 and supplies it as an excitation signal to the excitation coil.

The excitation coil generates a magnetic field corresponding to the triangular wave in the magnetic core of the magnetic element 100.

The detecting coil generates pulses in the period of time in which a positive excitation signal and a negative excitation signal alternate in the magnetic core.

The detection signal amplifier 2012 amplifies a voltage level of the pulses that are supplied from the detecting coil and outputs it as a detection signal to the detection signal comparator 2013.

The detection signal comparator 2013 determines the duration between the time point t1 and the time point t2 of the pulses (detection signals) and a difference between it and T/2 and outputs the difference to the feedback signal converter 2015.

The feedback signal converter 2015 determines, from the provided difference, a current value of the FB signal that is supplied to the FB coil.

Here, the feedback signal converter 2015 reads out a current value corresponding to the difference from an FB current value table that is written in and stored in an internal storage unit in advance and thereby determines a current value of the FB signal.

The FB current value table is a table showing a correspondence relationship between the aforementioned difference and a current value (digital value) that cancels a stationary magnetic field in the magnetic core.

The feedback signal adjuster 2014 carries out D/A (Digital/Analog) conversion of a current value of the FB signal supplied from the feedback signal converter 2015 and outputs an electrical current serving as an FB signal to the FB coil.

Furthermore, the feedback signal adjuster 2014 outputs a current value of the FB signal supplied from the feedback signal converter 2015 to the feedback signal adjuster 2014.

The feedback signal adjuster 2014 determines, based on the supplied current value of the FB signal, the intensity of a stationary magnetic field that is cancelled in the magnetic core, i.e., the intensity of a stationary magnetic field that is applied to the magnetic element 100.

Here, the feedback signal adjuster 2014 reads out a magnetic field intensity corresponding to a current value of the FB signal from the current value-magnetic field table that is written in and stored in the internal storage unit in advance and determines the intensity of the magnetic field applied to the magnetic element 100.

The current value-magnetic field table is a table showing a correspondence relationship between a current value of the above-mentioned FB signal and an intensity of the applied stationary magnetic field.

In the case of carrying out magnetic field detection in the magnetic proportion system by use of the above-mentioned magnetic element utilizing the time-resolved FG system, a measurable range of a magnetic field is determined by a magnitude of a generated magnetic field per unit current applied to a coil which is due to the material and the structure of the magnetic core of the magnetic element 100 (hereinbelow, refer to excitation efficiency) and by the intensity of an excitation signal.

On the other hand, in the case of carrying out magnetic field detection in the magnetic field balance system by use of the magnetic element utilizing the time-resolved FG system, the magnetic field in the magnetic core is maintained at an equilibrium condition so that a detection signal is output at a fixed time interval (T/2) without depending on the stationary magnetic field applied to the magnetic element 100.

For this reason, a magnetic field can be measured which is limited by the power supply voltage of the entire magnetic element 100, that is, in the range in which a current value of the FB signal can be supplied.

In the case of carrying out magnetic field detection in the magnetic proportion system by use of the magnetic element utilizing the time-resolved FG system, since the time interval by which the detection signal is output varies depending on the magnetic field, the linearity of the magnetic sensitivity is directly reflected by the characteristics of the magnetic element 100.

On the other hand, in the case of carrying out magnetic field detection in the magnetic field balance system by use of the magnetic element utilizing the time-resolved FG system, since the magnetic element has the characteristics such that magnetic field dependence is low, a waveform of the detection signal and a steady-state property of the time interval by which a detection signal is generated are easily maintained.

Because of this, in the case of using a magnetic element measuring a magnetic field as the subject of measurement which is generated by an electrical current having approximately several hundreds of A (ampere), in a state where the linearity is maintained in the entire range in which a current is to be measured, magnetic field detection utilizing a magnetic field balance system unlike a conventional magnetic proportion system is mainly employed.

In the case where magnetic field detection is carried out by use of the above-mentioned magnetic element utilizing the time-resolved FG system using the magnetic proportion system, the measurable range of a magnetic field is limited by the excitation efficiency of the magnetic element 100 and the excitation signal as described above.

Consequently, in the case where a magnetic element utilizing a magnetic proportion system is applied to a current sensor using a maximum measurement current of approximately several hundreds of A, there is a problem in that, additionally, a power supply voltage for driving a magnetic element or a maximum permissible current value is limited in addition to the dependence of output linearity of a single magnetic element with respect to the intensity of the magnetic field, and a magnetic field measurement range that can obtain an output linearity with a high level of accuracy is thereby limited.

Moreover, in the case where a waveform of the detection signal generated by a detecting coil varies depending on the intensity of the stationary magnetic field Flex and the temperature of the magnetic core, the time differentiation value at which a waveform of the detection signal rises up is correlated to a variation in the output detection signal.

Therefore, as a time variable value of the output detection signal varies depending on the intensity of the magnetic field, particularly, as the intensity of the magnetic field increases in measurement of an intensity of the magnetic field, the time variable value of the output detection signal increases, and it is not possible to detect a magnetic field with a high level of accuracy.

On the other hand, in the case of carrying out magnetic field detection by use of the magnetic element utilizing the time-resolved FG system using the magnetic field balance system, the FB signal is generally current-controlled under FB control using an FB coil.

As described above, since a current value of the FB control signal is proportionally related to the intensity of the magnetic field generated by the current value, the current value of the FB signal is controlled by a constant electric current even where the electrical resistance of the FB coil varies depending on the temperature thereof due to a difference in the current value of the FB signal.

Because of this, even in the magnetic field having a high intensity such that the current value of the FB signal increases, the linearity of sensitivity of the magnetic element can be maintained.

Furthermore, even where each of the excitation efficiencies of the excitation coil and the FB coil varies due to a deviation of individual difference in the characteristics of the magnetic elements, a convergent state of magnetic field balance of a magnetic field generated by the FB signal and a stationary magnetic field is limited by the characteristics of a control circuit that outputs the FB signal, and a residual (an error) which is due to convergent does not vary.

In addition, in the case where the ratio between the excitation efficiency of the excitation coil and the excitation efficiency of the FB coil is maintained constant, since the ratio between the magnetic sensitivities of the excitation coil and the FB coil does not vary, a convergent time does not vary until magnetic field balance of the magnetic field generated by the FB signal and a stationary magnetic field is obtained.

Accordingly, in the case of simultaneously forming the excitation coil and the FB coil provided in a magnetic element, such as in a semiconductor process, even where electrical resistances of the excitation coil and the FB coil vary, since the ratio of the coil resistance is maintained, a residual in an equilibrium condition which is an indicator of convergent of magnetic field balance and the time necessary for the equilibrium condition do not vary.

However, in the case of carrying out magnetic field detection by use of the magnetic element utilizing the time-resolved FG system using the magnetic field balance system, and in the case of controlling an intensity of the magnetic field that is generated by the FB coil and by a current value of the FB signal, it is necessary to control a current value corresponding to the intensity of the magnetic field under constant current control.

For this reason, a current-voltage conversion circuit that carries out constant current control is required for packaging, a circuit scale of a controller that controls an electrical current to be applied to the FB coil becomes larger, and a consumption current increases.

Moreover, an inside reference potential during generation of a constant electric current in the current-voltage conversion circuit temporally varies with an increase in a current value of the FB signal and becomes unstable, a constant current to be output thereby varies.

SUMMARY OF THE INVENTION

The invention was made in view of the above-described situation, and has an object to provide a magnetic element control device, magnetic device control method, and magnetic detecting device, which carry out magnetic field detection by a magnetic field balance system by use of a magnetic element configured by only an excitation coil and a detecting coil and using a magnetic element utilizing a time-resolved FG system and which do not require provision of a current-voltage conversion circuit for supplying a constant electric current to an FB coil.

The invention was made in order to solve the above problems. A magnetic element control device according to a first aspect of the invention controls a magnetic element during detection of an intensity of a stationary magnetic field by a time-resolved magnetic balance system where the magnetic field is applied to a flux-gate magnetic element that is constituted of an excitation coil and a detecting coil. The device includes: an excitation signal generator that generates an alternating signal; an excitation signal adjuster that generates an alternating voltage signal from the alternating signal and generates an excitation signal to be applied to the excitation coil based on the alternating voltage signal; a detection signal comparator that detects a detection signal of a positive voltage or a negative voltage which is generated by an induced electromotive force when an electrical current direction of the excitation signal is switched; a feedback signal converter that converts a duration between the detection signals of the positive voltage and the negative voltage into voltage information; a feedback signal adjuster that, based on the voltage information, generates a feedback signal for generating a magnetic field that cancels a stationary magnetic field that is applied to the magnetic element; and a data signal converter that outputs the feedback signal as a data signal indicating a magnetic field intensity, wherein the excitation signal adjuster superimposes the feedback signal on the alternating voltage signal and thereby generates the excitation signal, and applies the generated excitation signal to the excitation coil.

In the magnetic element control device according to the first aspect of the invention, it is preferable that the data signal converter amplify the feedback signal by a preset amplification rate and output the signal where a voltage value that is out of a voltage range of the feedback signal, in which a magnetic field intensity generated by a voltage value of the feedback signal and the voltage value of the feedback signal have a linearity, is saturated at the amplification rate.

It is preferable that the magnetic element control device according to the first aspect of the invention further include an offset voltage adjuster that superimposes an offset voltage corresponding to a magnetic field which is due to an ambient environment for measurement of a stationary magnetic field on the feedback signal and outputs the feedback signal, on which the offset voltage is superimposed, to the feedback signal adjuster.

It is preferable that the magnetic element control device according to the first aspect of the invention further include a temperature sensor that measures a temperature of the magnetic element, wherein the excitation signal adjuster corrects the alternating voltage signal by multiplying the alternating voltage signal by a coefficient corresponding to the temperature, superimposes the feedback signal on the corrected alternating voltage signal, and supplies the superimposed alternating voltage signal serving as the excitation signal to the excitation coil.

It is preferable that the magnetic element control device according to the first aspect of the invention further include a temperature sensor that measures a temperature of the magnetic element, wherein the excitation signal generator adjusts a period of the alternating voltage signal so as to correspond to a coefficient corresponding to the temperature, superimposes the feedback signal on the adjusted alternating voltage signal, and supplies the superimposed alternating voltage signal serving as the excitation signal to the excitation coil.

In the magnetic element control device according to the first aspect of the invention, it is preferable that the feedback signal converter determine, from the duration, a duty ratio indicating a voltage value of the feedback signal as the voltage information, and output a rectangular wave having the duty ratio indicating the voltage value of the feedback signal to the feedback signal adjuster, and that the feedback signal adjuster generate the feedback signal that is a direct-current voltage based on the duty ratio of the rectangular wave.

In the magnetic element control device according to the first aspect of the invention, it is preferable that the feedback signal converter determine a difference between the duration and a preset reference duration, determine, from the difference, a digital value indicating a voltage value of the feedback signal as the voltage information, and output the digital value to the feedback signal adjuster, and that the feedback signal adjuster generate the feedback signal that is a direct-current voltage indicated by the digital value.

In the magnetic element control device according to the first aspect of the invention, it is preferable that, when a mode of detecting an intensity of a magnetic field is selected by a time-resolved magnetic proportion system, the feedback signal adjuster set a voltage value of the feedback signal to be 0 V and supplies the voltage value to the excitation signal adjuster, and the feedback signal converter output the duration as measurement data of the stationary magnetic field.

It is preferable that the magnetic element control device according to the first aspect of the invention further include a clock signal generator that generates a periodic clock signal wherein the excitation signal generator generates a triangular wave signal as the alternating signal that is synchronized with the clock signal.

A magnetic device control method according to a second aspect of the invention controls a magnetic element during detection of an intensity of a stationary magnetic field by a time-resolved magnetic balance system where the magnetic field is applied to a flux-gate magnetic element that is constituted of an excitation coil and a detecting coil. The method includes: generating an alternating signal (excitation signal generation step); generating an alternating voltage signal from the alternating signal; generating an excitation signal to be applied to the excitation coil based on the alternating voltage signal (excitation signal adjustment step); detecting a detection signal of a positive voltage or a negative voltage which is generated by an induced electromotive force when an electrical current direction of the excitation signal is switched (detection signal comparison step); converting a duration between the detection signals of the positive voltage and the negative voltage into voltage information (feedback signal conversion step); based on the voltage information, generating a feedback signal for generating a magnetic field that cancels a stationary magnetic field that is applied to the magnetic element (feedback signal adjustment step); and outputting the feedback signal as a data signal indicating a magnetic field intensity (data signal conversion step), wherein when the excitation signal is generated (excitation signal adjustment step), the feedback signal is superimposed on the alternating voltage signal and the excitation signal is thereby generated, and the generated excitation signal is applied to the excitation coil.

A magnetic detecting device according to a third aspect of the invention uses a magnetic field balance system that detects an intensity of an applied stationary magnetic field. The device includes: a flux-gate magnetic element that is constituted of an excitation coil and a detecting coil; an excitation signal generator that generates an alternating signal; an excitation signal adjuster that generates an alternating voltage signal from the alternating signal and generates an excitation signal to be applied to the excitation coil based on the alternating voltage signal; a detection signal comparator that detects a detection signal of a positive voltage or a negative voltage which is generated by an induced electromotive force when an electrical current direction of the excitation signal is switched; a feedback signal converter that converts a duration between the detection signals of the positive voltage and the negative voltage into voltage information; a feedback signal adjuster that, based on the voltage information, generates a feedback signal for generating a magnetic field that cancels a stationary magnetic field that is applied to the magnetic element; and a data signal converter that outputs the feedback signal as a data signal indicating a magnetic field intensity, wherein the excitation signal adjuster superimposes the feedback signal on the alternating voltage signal and thereby generates the excitation signal, and applies the generated excitation signal to the excitation coil.

EFFECTS OF THE INVENTION

According to the aspect of the invention, a feedback signal of a voltage value for generating a magnetic field that cancels a stationary magnetic field is superimposed on the excitation signal, a feedback signal when the stationary magnetic field is cancelled (a magnetic intensity becomes 0) is used as measurement data that indicates a magnetic field intensity.

Consequently, measurement of a magnetic field intensity in the magnetic balance system is carried out by use of a magnetic element having the same constitution as that of a magnetic proportion system (a magnetic element that does not include an FB coil and is constituted of an excitation coil and a detecting coil).

As a result, according to the aspect of the invention, it is possible to reduce the size of a magnetic element that is used in a magnetic detecting device, it is possible to downsize the magnetic detecting device, and it is thereby possible to reduce the cost of manufacturing by size reduction.

DETAILED DESCRIPTION OF THE INVENTION

<Principle of Invention>

Hereinafter, the principle of the invention will be described with reference to drawings.

Figure 1:
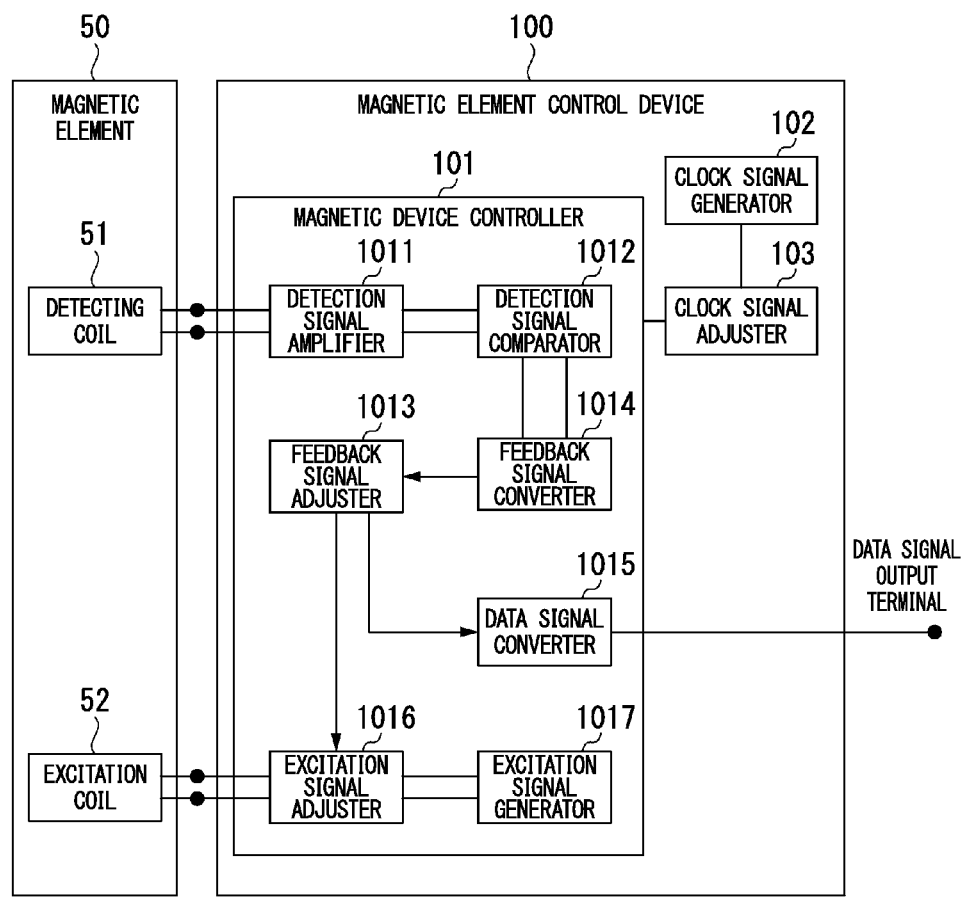
FIG. 1 is a diagram showing the principle of the invention.

FIG. 1 is a diagram showing the principle of the invention.

A magnetic element control device 100 includes a magnetic device controller 101, a clock signal generator 102, and a clock signal adjuster 103.

When the intensity of a stationary magnetic field to be applied to the flux-gate magnetic element 50 that is constituted of a detecting coil 51 and an excitation coil 52 is detected by a time-resolved magnetic balance system, the magnetic element control device 100 according to the embodiment of the invention controls an excitation signal that is to be applied to the excitation coil 52.

The magnetic device controller 101 includes a detection signal amplifier 1011, a detection signal comparator 1012, a feedback signal adjuster 1013, a feedback signal converter 1014, a data signal converter 1015, an excitation signal adjuster 1016, and an excitation signal generator 1017.

The clock signal generator 102 includes an oscillator that generates a clock signal having a predetermined period, and the clock signal generator outputs the generated clock signal to the clock signal adjuster 103.

The clock signal adjuster 103 carries out processes of amplifying a signal level of the supplied clock signal, changing a period of the clock signal, or the like, and outputs the resultant processed clock signal to the excitation signal generator 1017.

Based on the clock signal supplied from the clock signal adjuster 103, the excitation signal generator 1017 generates a triangular wave signal serving as an alternating signal such as an alternating voltage signal alternating with a reference potential of 0 V.

The excitation signal adjuster 1016 amplifies the triangular wave signal generated by the excitation signal generator 1017 at a predetermined amplification rate, generates a triangular wave voltage signal, and thereby applies it to the excitation coil 52.

Figure 2:
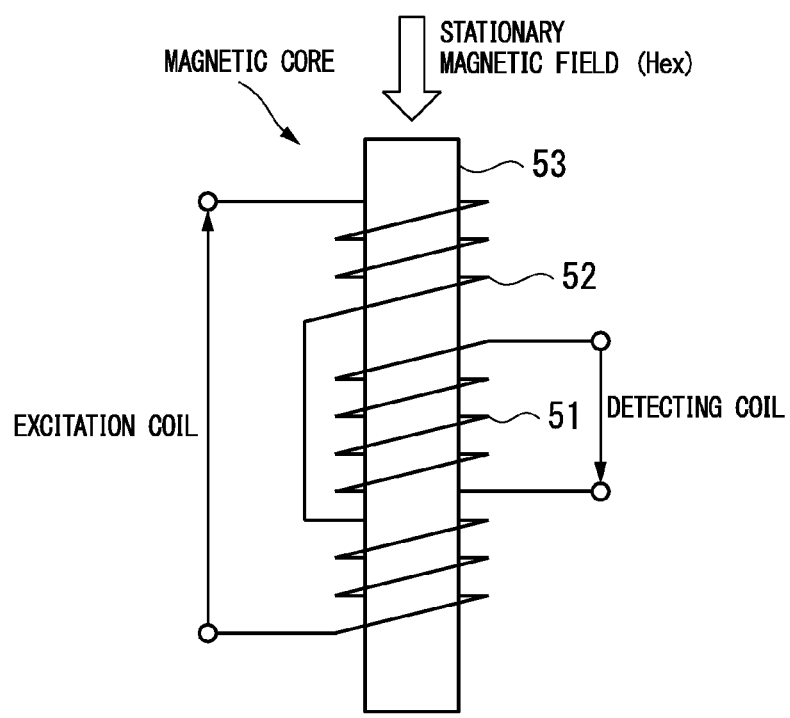
FIG. 2 is a view showing a configuration example of a magnetic element 50 serving as a flux-gate magnetic element.

Next, FIG. 2 is a view showing a configuration example of the magnetic element 50 serving as a flux-gate magnetic element.

Windings of two lines are wound around the magnetic core 53, and the magnetic element 50 is thereby configured by the detecting coil 51 formed by a winding of one line and the excitation coil 52 formed by a winding of the other line.

Figure 3:
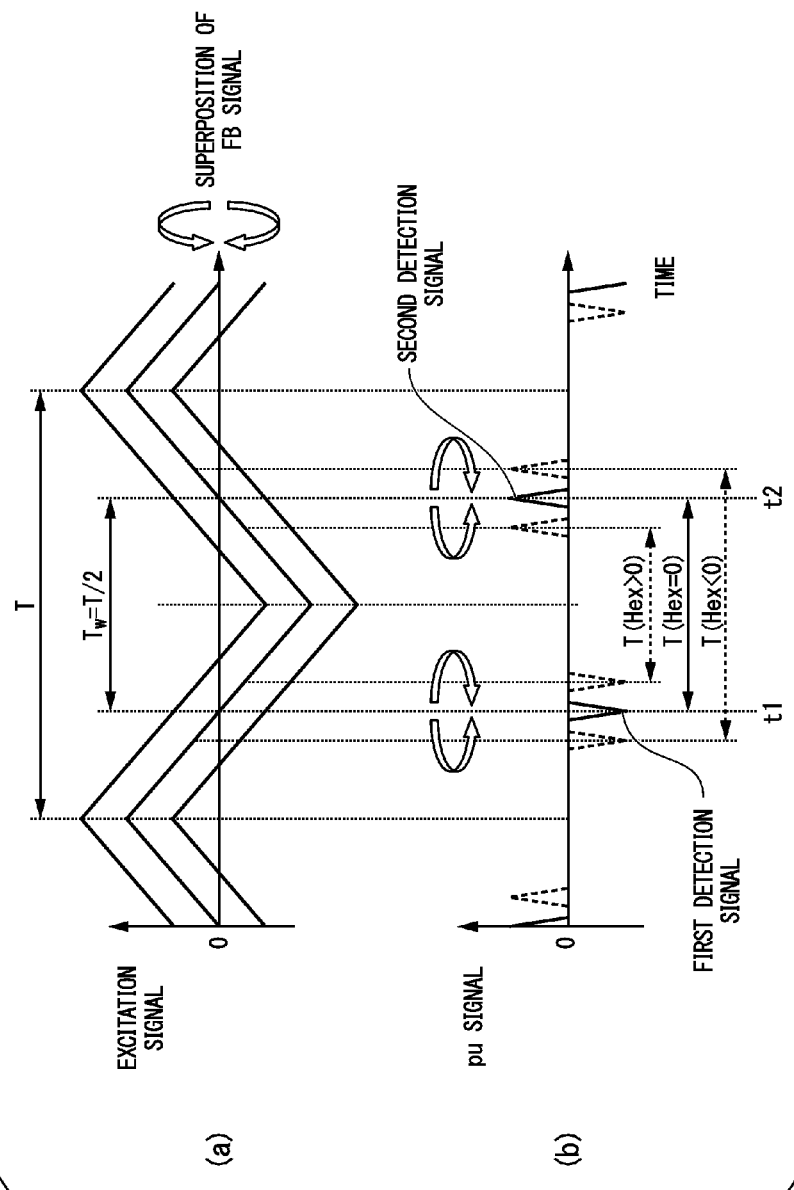
FIG. 3 is a chart showing the operating principle of a flux-gate magnetic element.

Next, FIG. 3 is a chart showing the operating principle of a flux-gate magnetic element.

PART (a) of FIG. 3 shows time variation in a triangular wave voltage signal that is to be supplied to the excitation coil 52, the axis of ordinate represents a voltage, and the axis of abscissas represents the passage of time.

In PART (a) of FIG. 3, the triangular wave voltage signal that is to be supplied to the excitation coil 52 is an alternating signal between the positive and the negative, and a standard reference voltage Vref (0 V in the embodiment as an example) is the boundary therebetween.

In PART (b) of FIG. 3, the axis of ordinate represents a voltage, and the axis of abscissas represents the passage of time.

PART (b) of FIG. 3 is a chart showing time change of a detection signal (a first detection signal at the time point t1 and a second detection signal at the time point t2) that is generated in the detecting coil 51 by an induced electromotive force when a direction of the excitation current that flows in the excitation coil 52 due to the triangular wave voltage signal shown in PART (a) of FIG. 3 varies (the polarity of the voltage value of the triangular wave voltage signal varies, and the polarity of the current value of the excitation current thereby varies).

Here, PART (a) of FIG. 3 shows that, as the stationary magnetic field (Hex) is applied to the magnetic element 50, a reference potential of the triangular wave voltage signal that is applied to the excitation coil 52 is displaced from the standard reference voltage Vref by the magnitude of the DC voltage for generating the applied stationary magnetic field.

Additionally, it shows that timings of generations of the first detection signal (the time point t1) and the second detection signal (the time point t2) are displaced to each other in time so as to correspond to the displacement of the triangular wave voltage signal from the standard reference voltage Vref which is due to the stationary magnetic field (Hex).

Here, as evidenced by PART (b) of FIG. 3, when the difference Td between the duration TW which is between the time point t1 of the first detection signal and the time point t2 of the second detection signal and the time length T/2 which means ½ of a period T of the triangular wave is 0, a stationary magnetic field (Hex) is not applied to the magnetic element 50. When the difference Td is positive, a negative stationary magnetic field (Hex<0) is applied to it. When the difference Td is negative, a positive stationary magnetic field (Hex>0) is applied to it.

Returning to FIG. 1, the detection signal amplifier 1011 amplifies the voltage between both ends of the detecting coil 51 of the magnetic element 50 by a preset amplification degree.

The detection signal comparator 1012 compares a voltage value of the amplified detection signal to be supplied from the detection signal amplifier 1011 to a preliminarily-determined threshold voltage value, and detects the first detection signal and the second detection signal (refer to PART (b) of FIG. 3).

Here, as shown in FIG. 3, the first detection signal is a pulse having a negative polarity and is generated by an induced electromotive force in the voltage region in which the polarity of a voltage that is to be applied to the excitation coil 52 is changed from positive to negative.

On the other hand, the second detection signal is a pulse having a positive polarity and is generated by an induced electromotive force in the voltage region in which the polarity of a voltage that is to be applied to the excitation coil 52 is changed from negative (negative voltage) to positive (positive voltage).

Particularly, in the aforementioned explanation, the case where an excitation signal that is to be applied to the excitation coil 52 is a signal used in voltage control is described; however, an excitation signal may be a signal used in current control.

Furthermore, it may include both signals used in voltage control and current control.

Particularly, the axis of ordinate component in PART (a) of FIG. 3 may represent a current value.

In this case, a reference current value of an alternating signal in PART (a) of FIG. 3 is 0 A (zero amperes).

Particularly, in the aforementioned explanation, the case where the axis of ordinate component in PART (a) of FIG. 3 is represented as a voltage and an excitation signal applied to an excitation coil is represented as a voltage is described; however, the axis of ordinate component may be represented as a current value of an excitation signal flowing in the excitation coil 52.

In this case, in PART (a) of FIG. 3, an electrical current is 0 A (zero amperes) on the axis of ordinate which intersects with the axis of abscissas (standard reference voltage Vref expressed by voltage).

According to the principle of the invention, even where any of the constitution that carries out a digital processing by calculation using a digital value and the constitution that carries out an analog processing by calculation using an analog value is used as a constitution that generates a voltage of the feedback signal serving as the FB signal, it is possible to configure the magnetic element control device 100.

Hereinbelow, a constitution that generates a voltage of the feedback signal using the digital processing and a constitution that generates a period voltage using the analog processing will be described in this order.

Constitution for Generating Voltage of Feedback Signal by Digital Processing

The detection signal comparator 1012 measures a duration between a first detection signal and a second detection signal, determines the length of time between the duration Tw and a half of the period T of the triangular wave, i.e., a difference Td with respect to T/2 (=Tw−(T/2)), and outputs it to the feedback signal converter 1014.

When the difference Td that means time information is supplied from the detection signal comparator 1012, the feedback signal converter 1014 generates voltage information for generating a voltage of the feedback signal serving as the FB signal from the difference Td.

Here, a time-voltage information table that shows a correspondence relationship between the difference Td and voltage information indicating a digital value corresponding to the difference Td is written in and stored in a storage unit inside the feedback signal converter 1014 in advance.

Subsequently, the feedback signal converter 1014 reads out, from the time-voltage information table stored in the storage unit provided thereinside, the voltage information corresponding to the difference Td to be supplied, and outputs it to the feedback signal adjuster 1013.

The voltage information is, for example, data indicating a digital value that represents the voltage value of the feedback signal.

Additionally, the difference Td has a polarity in the voltage information. Particularly, in the case where the difference Td is positive, it has a positive polarity. In the case where, the difference Td is negative, it has a negative polarity.

Consequently, in the case where a stationary magnetic field (Hex) having a positive polarity is applied to the magnetic element 50, a feedback signal having the negative polarity voltage is superimposed on the voltage of the excitation signal. On the other hand, in the case where the stationary magnetic field (Hex) having the negative polarity is applied to it, a feedback signal having the positive negative polarity voltage is superimposed on the voltage of the excitation signal.

Based on the voltage information supplied from the feedback signal converter 1014, the feedback signal adjuster 1013 generates a feedback signal having a voltage value that indicates the voltage information, and outputs it as the FB signal to the excitation signal adjuster 1016.

Here, since the voltage information is a digital value, the feedback signal adjuster 1013 is provided with, for example, a D/A converter thereinside, obtains a direct-current voltage by inputting the voltage information that is a digital value to be supplied to the D/A converter, and outputs it as the feedback signal to the excitation signal adjuster 1016.

The excitation signal adjuster 1016 causes the feedback signal that is the FB signal supplied from the feedback signal adjuster 1013 to be superimposed on the triangular wave voltage signal that is generated thereinside, and outputs it as an excitation signal to the excitation coil 52.

Moreover, in the case where the feedback signal is superimposed on the excitation signal, the time interval between the first detection signal and the second detection signal, which are detected by the detection signal comparator 1012, is near T/2.

Consequently, in the case where the feedback signal was already superimposed on the excitation signal, time information which is to be output is an error voltage that represents an error of the feedback signal having T/2 and a currently-applied feedback signal in the detection signal comparator 1012.

Because of this, in the case where the excitation signal is applied, the detection signal comparator 1012 outputs the difference Td serving as time information, which represents the aforementioned error voltage, to the feedback signal converter 1014.

Additionally, when the difference Td of time information which represents an error voltage is supplied, the feedback signal converter 1014 reads out, from the time-voltage information table stored in the storage unit provided thereinside, the voltage information corresponding to the difference Td as described above, and outputs it to the feedback signal adjuster 1013.

Moreover, the feedback signal adjuster 1013 includes a storage unit provided thereinside, voltage information is added in and stored in the storage unit, and the feedback signal adjuster generates a feedback signal based on the cumulated voltage information.

Here, the feedback signal adjuster 1013 determines whether or not the voltage information corresponding to the difference Td is included in a preset setting voltage range.

Subsequently, in the case where the voltage information is not included in the setting voltage range, the feedback signal adjuster 1013 determines that the stationary magnetic field applied to the magnetic element 50 is a voltage that does not affect the cancelling.

Particularly, the feedback signal adjuster 1013 determines that it is an error in control accuracy and the duration between the first detection signal and the second detection signal is substantially T/2.

At this time, the feedback signal adjuster 1013 does not add the voltage information, which is in an error range, in the last-minute time information stored in the storage unit provided thereinside, and discards it.

The data signal converter 1015 amplifies the voltage information supplied from the feedback signal adjuster 1013 by a preset amplification degree and outputs it outside thereof.

The amplification degree of the data signal converter 1015 is set to a value at which a range of the voltage value of the feedback signal, which is in a range of capable of preliminarily and linearly measuring the voltage, is only output as a data signal.

In particular, by the amplification degree, a voltage is obtained at which a range in which a magnetic field for cancelling a stationary magnetic field and a feedback signal having a voltage value for generating the magnetic field maintain linearity is only amplified, and a voltage that is in out of the range is saturated and is in a constant voltage.

That is, the data signal converter 1015 amplifies the feedback signal by a preset amplification rate and outputs it. Here, a voltage value of the feedback signal that is out of a voltage range of the feedback signal in which a voltage value of the feedback signal and a magnetic field intensity generated by the voltage value have linearity is saturated at the preset amplification rate.

Consequently, the data signal represents a magnetic field voltage that determines that an intensity of a magnetic field cancelling a stationary magnetic field, that is, represents an intensity of a stationary magnetic field.

A magnetic-field-intensity detecting device (not shown in the figure) that is provided outside converts a voltage value of the magnetic field voltage indicating the data signal into an intensity of the magnetic field, and outputs the converted intensity of the magnetic field.

Here, a magnetic field intensity table that shows a correspondence relationship between a voltage value of the magnetic field voltage and an intensity of the magnetic field corresponding to the voltage value of the magnetic field voltage is written in and stored in a storage unit inside the magnetic-field-intensity detecting device in advance.

The magnetic-field-intensity detecting device reads out, from the magnetic field intensity table, a magnetic field intensity which corresponds to the voltage value of the magnetic field voltage represented by the data signal and is supplied from the magnetic element control device 100, and displays it as a value of an intensity of stationary magnetic field (Hex) on a display unit provided in the magnetic-field-intensity detecting device itself.

In the embodiment of the invention, the magnetic detecting device is constituted of the magnetic element control device 100 and the aforementioned magnetic-field-intensity detecting device which is not shown in the figure.

Constitution for Generating Voltage of Feedback Signal by Analog Processing

The detection signal comparator 1012 outputs the first detection signal and the second detection signal to the feedback signal converter 1014.

The feedback signal converter 1014 generates a pulse having a duty ratio serving as voltage information based on a period at which the first detection signal and the second detection signal are output (the distance between the time point t1 and the time point t2, that is, duration), and outputs the pulse as voltage information to the feedback signal adjuster 1013.

Particularly, the feedback signal converter 1014 determines, from the above-mentioned duration, a duty ratio serving as voltage information and indicating the voltage value of the feedback signal, and outputs a rectangular wave representing the duty ratio indicating the voltage value of the feedback signal to the feedback signal adjuster 1013.

In the case where information is shown by a rectangular wave signal, the feedback signal adjuster 1013 generates a direct-current voltage corresponding to the duty ratio by a PWM (Pulse Width Modulation) circuit or the like, and outputs it as the feedback signal.

In the case where, for example, a duration from a first detection signal to a second detection signal is longer than a duration from the second detection signal to the first detection signal, it is necessary for the stationary magnetic field to be negative.

Because of this, the feedback signal adjuster 1013 generates a feedback signal of a direct-current voltage for generating a positive magnetic field that cancels a stationary magnetic field.

In contrast, in the case where the duration from the second detection signal to the first detection signal is longer than the duration from a first detection signal to a second detection signal, since the stationary magnetic field is positive, the feedback signal adjuster 1013 generates a feedback signal of a direct-current voltage for generating a negative magnetic field that cancels a stationary magnetic field.

Particularly, when a pulse that is voltage information is supplied, the feedback signal adjuster 1013 generates a feedback signal having the voltage value corresponding to the duty ratio of the pulse, and outputs the generated feedback signal to the excitation signal adjuster 1016.

Here, a current-voltage conversion circuit that is configured by use of, for example, an operational amplifier is provided in the feedback signal adjuster 1013.

In the current-voltage conversion circuit, an amplifier having a function of an operational amplifier is used, the amplifier functions so that a difference in electrical potentials between a positive input and a negative input is maintained to be zero, and therefore, a current signal which is from an output of the amplifier to a positive input is proportionally related to an external magnetic field.

Consequently, as a result of applying a signal, that is proportional to the current signal and serves as the feedback signal, to the excitation coil 52, a magnetic field is generated by the feedback signal, and a magnetic field that is applied to the magnetic core inside the magnetic element 50 is controlled so as to be constant.

As a result, the time interval between the first detection signal and the second detection signal can be maintained constant without relying on an external stationary magnetic field.

Similar to the case of the digital processing, the excitation signal adjuster 1016 superimposes the feedback signal supplied from the feedback signal adjuster 1013 on the triangular wave voltage signal that is generated inside a control circuit, and outputs the triangular wave voltage signal, on which the feedback signal is superimposed and which serving as an excitation signal, to the excitation coil 52.

Except to amplify an analog value, the operation of the data signal converter 1015 is the same as that of the digital processing, and an explanation therefor is omitted here.

Furthermore, external magnetic-field-intensity detecting device converts the data signal of an analog value supplied from the magnetic element control device 100 into a digital value by A/D (Analog/Digital) conversion, and determines the magnetic field intensity in the same manner as in the above described digital processing operation.

According to the embodiment of the invention, with the constitution described above, since the feedback signal is superimposed on the excitation signal and the excitation signal is applied to the excitation coil 52, it is possible to utilize a commonly-used magnetic element in the magnetic proportion system thereof.

Furthermore, unlike a magnetic element that is provided with an FB coil used to measure the magnetic field intensity in a conventional time-resolved magnetic balance system, it is possible to form an inexpensive and downsized magnetic detecting device.

Here, in the case where the magnetic element is reduced in size as well as the size of the magnetic element is the same as that of a magnetic balance system, as a result of using the region of the FB coil and of increasing the number of windings of an excitation coil or a detecting coil, excitation efficiency increases, and the measurement range of a stationary magnetic field can be widened or the S/N ratio (Signal/Noise) of a detection signal in the detecting coil can be improved.

Moreover, according to the embodiment of the invention, regardless of utilizing a commonly-used magnetic element in the magnetic proportion system thereof, the intensity range of the stationary magnetic field applied to a magnetic element can be wider than that in the case of magnetic field detection in the magnetic proportion system thereof.

In addition, according to the embodiment of the invention, since the feedback signal as the FB signal is superimposed on the triangular wave voltage signal, a time variability of a reference voltage of a differential signal when a constant electric current (the FB signal) is generated can be stabilized, and a time variability of a data signal to be output can be reduced, as compared with the case of applying an FB signal as an electrical current to a conventional FB coil.

Furthermore, according to the embodiment of the invention, when the excitation signal generator 1017 generates a triangular wave, in order to avoid a nonlinear region located near the reference potential (hereinbelow, refer to crossover distortion) which is due to characteristics of the operational amplifier used for generation, it is possible to correct the time interval between detection signals (the first detection signal and the second detection signal) by FB control.

For example, in order to accurately determine the timing at which magnetic balance is obtained, adjustment is carried out so that the reference potential intersects with a region of a triangular wave that does not have a crossover distortion by providing offset to the triangular wave voltage signal in advance.

Even in the case of a magnetic balance system using an FB coil, control can be carried out so as to avoid a crossover distortion; however, in this case, since it is necessary to once convert a feedback current used as an FB signal into a feedback signal that is a voltage signal, it is not constant current control.

As a result, the degree of accuracy of detection of a magnetic field intensity becomes degraded due to the temperature of the magnetic element 50.

First Embodiment

Next, a magnetic element control device 110 according to a first embodiment of the invention will be described with reference to FIG. 4.

Figure 4:
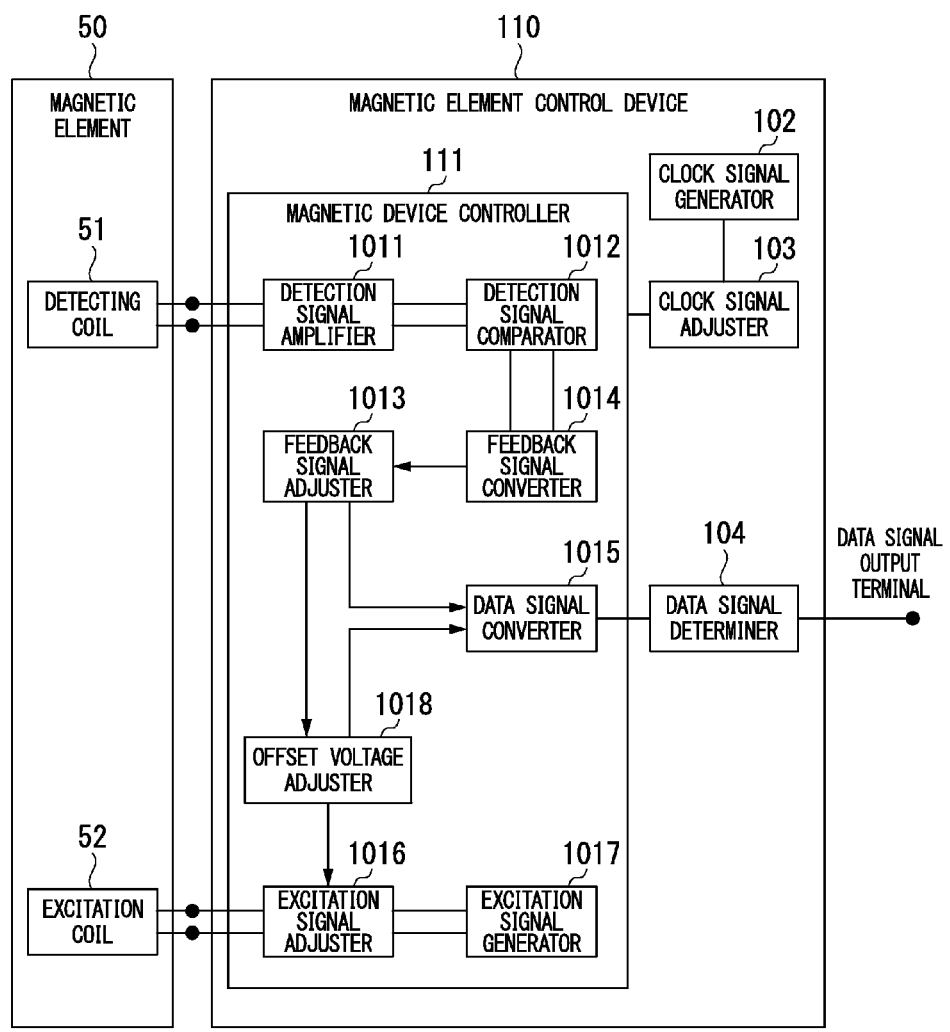
FIG. 4 is a view showing a configuration example of a magnetic element control device 110 according to a first embodiment.

FIG. 4 is a view showing a configuration example of a magnetic element control device 110 according to the embodiment.

Identical reference numerals are used for the constitutions which are identical to those of the magnetic element control device 100 which is shown in FIG. 1 and described in the principle of the embodiment of the invention.

In FIG. 4, the magnetic element control device 110 includes a magnetic device controller 111, the clock signal generator 102, the clock signal adjuster 103, and a data signal determiner 104.

Hereinbelow, only differences from the constitution and the operation of the magnetic element control device 100 shown in FIG. 1 will be described.

In a state where a stationary magnetic field (Hex) as the subject of measurement is not applied to the magnetic element 50 and in the case where the duration between the first detection signal and the second detection signal is displaced from a reference duration, for example, T/2 that is a half of the period T of the triangular wave, an offset voltage adjuster 1018 in the magnetic device controller 111 generates an offset voltage used to correct the displacement.

The offset voltage causes a stationary magnetic field of 0. Corresponding to an intensity of the magnetic field generated depending on the environment around the position at which the magnetic element 50 is provided, the offset voltage is set as a voltage that cancels the magnetic field.

Consequently, the offset voltage adjuster 1018 adds an offset voltage generated by the offset voltage adjuster 1018 itself to the feedback signal supplied from the feedback signal adjuster 1013, and outputs the resulting sum as a new feedback signal to the excitation signal adjuster 1016.

The data signal determiner 104 determines whether or not a voltage value of the data signal supplied from the data signal converter 1015 is included in a preset data range (output data designated range).

The above-mentioned data range is written in and stored in a storage unit inside the data determiner 104 in advance.

The data range is a voltage value range for determining whether or not a voltage value indicated by the data signal that is amplified and output by the data signal converter 1015 is included in a region in which the magnetic field is linearly related to a voltage value indicating this magnetic field.

Here, in the case where the voltage value of the data signal is not included in the data range, the data signal determiner 104 outputs a data signal indicating an error (error signal) to an external magnetic-field-intensity detecting device.

Moreover, in the case where the voltage value of the data signal is included in the data range, the data signal determiner 104 outputs a data signal indicating a voltage value to an external magnetic-field-intensity detecting device.

Next, an operation of the magnetic element control device 110 according to the embodiment will be described with reference to FIGS. 4 and 5.

Figure 5:
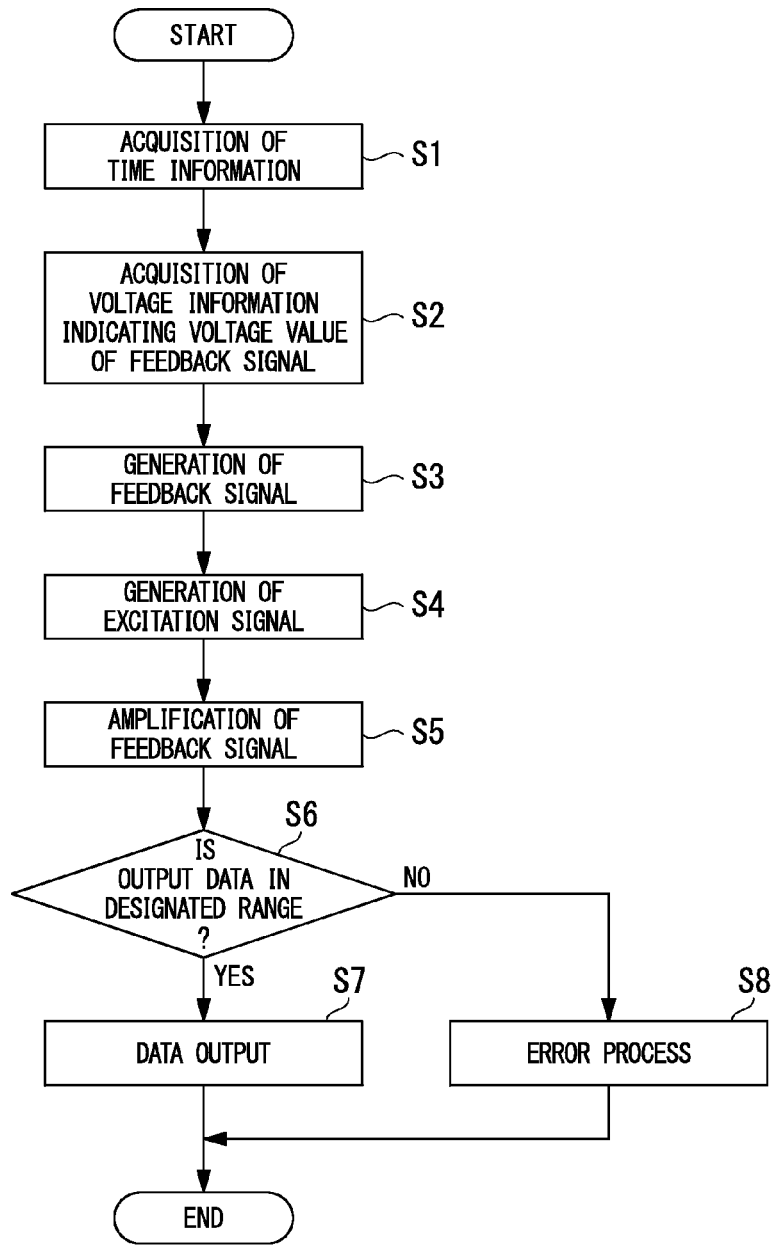
FIG. 5 is a flowchart showing an example of operating the magnetic element control device 110 according to the first embodiment.

FIG. 5 is a flowchart showing an example of operating the magnetic element control device 110 according to the embodiment.

In the first embodiment, a constitution that generates a feedback signal by digital processing will be described.

Also, regarding a constitution that generates a feedback signal by analog processing, the magnetic element control device 110 can be similarly operated based on flow in the flowchart shown in FIG. 5.

Step S1:

The detection signal amplifier 1011 amplifies a voltage between both ends of the detecting coil 51 and outputs it to the detection signal comparator 1012.

Subsequently, the detection signal comparator 1012 subtracts T/2 that is a reference duration from the duration Tw between the time point t1 at which the first detection signal is detected and the time point t2 at which the second detection signal is detected, and outputs the difference Td which is the result of subtraction as time information to the feedback signal converter 1014.

In addition, in the case of converting the time information into a digital value, it is preferable to use a TDC (Time point to Digital Converter) or the like.

Step S2:

Next, the feedback signal converter 1014 reads out, from the time-voltage information table stored in the storage unit, the voltage information indicating the voltage value of the feedback signal corresponding to the difference Td that is the time information to be supplied.

Subsequently, the feedback signal converter 1014 outputs the read-out voltage information to the feedback signal adjuster 1013.

Step S3:

Next, the feedback signal converter 1014 reads out last-minute voltage information that is stored in the storage unit provided thereinside and indicates the feedback signal superimposed on a current triangular wave voltage signal.

Thereafter, the feedback signal converter 1014 adds voltage information supplied from the detection signal to the voltage information read out from the storage unit.

Based on the resulting sum of the voltage information, the feedback signal converter 1014 generates a feedback signal having a voltage value indicating the voltage information, and outputs it to the offset voltage adjuster 1018.

Additionally, the feedback signal converter 1014 causes the resulting sum of the voltage information to be written in and stored in the storage unit provided thereinside as new voltage information that becomes is the last-minute information, and outputs the voltage information (digital value) to the data signal converter 1015.

Step S4:

Next, the offset voltage adjuster 1018 adds an offset voltage generated by the offset voltage adjuster 1018 itself to the feedback signal to be supplied, and outputs it as a new feedback signal to the excitation signal adjuster 1016.

Additionally, the offset voltage adjuster 1018 outputs offset information that is stored in the storage unit provided thereinside and is a digital value indicating the offset voltage to the data signal converter 1015.

Subsequently, the excitation signal adjuster 1016 superimposes the period voltage supplied from the offset voltage adjuster 1018 on the triangular wave voltage signal that is synchronized with the clock signal output from the clock signal adjuster 103, and outputs it as an excitation signal to the excitation coil 52.

Step S5:

Next, the data signal converter 1015 subtracts, from the voltage information that is supplied from the feedback signal adjuster 1013, the offset information that is supplied from the offset voltage adjuster 1018, and sets the result of subtraction as new voltage information.

Subsequently, the data signal converter 1015 amplifies the voltage information of the result of subtraction at the preset amplification degree, and outputs the result of amplification as a data signal to the data signal determiner 104.

Step S6:

Next, the data signal determiner 104 determines whether or not the voltage value represented by the data signal is included in the preset data range.

At this time, in the case where the voltage value represented by the data signal is included in the data range, the data signal determiner 104 causes the process to proceed to Step S7. On the other hand, in the case where the voltage value represented by the data signal is not included in the data range, the process proceeds to Step S8.

Step S7:

Next, Since the data signal is included in the data range, the data signal determiner 104 outputs the data signal while being unmodified to a magnetic-field-intensity detecting device that is placed outside.

Thereafter, the external magnetic-field-intensity detecting device reads out, from the magnetic field intensity table stored in the inside storage unit, the magnetic field intensity corresponding to the voltage value represented by the supplied data signal, and displays the read-out magnetic field intensity on the display unit of the external magnetic-field-intensity detecting device itself.

Step S8:

On the other hand, since the data signal is not included in the data range, the data signal determiner 104 discards the data signal, and outputs an error signal to a magnetic-field-intensity detecting device that is placed outside.

At this time, for example, when an error signal is supplied to the magnetic-field-intensity detecting device, the magnetic-field-intensity detecting device displays, on the display unit of the magnetic-field-intensity detecting device, information to be notified to a user that it exceeds the measurement range.

When power is supplied to the magnetic element control device 110, the magnetic element control device carries out processes of Steps S1 to Step S8 in accordance with a flowchart shown in the above-described FIG. 5.

Here, when a magnetic field intensity as the subject of measurement is measured, in the case where a magnetic field of the subject of measurement is not present, the above-described measurement of Steps S1 to S8 is carried out, the obtained measurement value is set to the offset voltage adjuster 1018.

Subsequently, after an offset voltage is set to the offset voltage adjuster 1018, measurement of a magnetic field intensity that is the subject of measurement is carried out by the processes of Steps S1 to S8.

Furthermore, when power is supplied to the magnetic element control device 110, the feedback signal adjuster 1013 resets data of integrated voltage information stored in the storage unit provided thereinside by writing 0 as an initial value therein.

According to the embodiment, since the feedback signal that is the FB signal is superimposed on the excitation signal and the excitation signal is applied to the excitation coil 52, it is possible to utilize a commonly-used magnetic element in the magnetic proportion system thereof.

Furthermore, unlike a magnetic element that is provided with an FB coil used in a conventional magnetic balance system, it is possible to configure an inexpensive and downsized magnetic detecting device.

Here, in the case where the magnetic element is reduced in size and the magnetic element is the same size as that in a magnetic balance system, as a result of using the region of the FB coil and increasing the number of windings of an excitation coil or a detecting coil, excitation efficiency increases, and the measurement range of a stationary magnetic field can be widened or the S/N ratio (Signal/Noise) of a detection signal in the detecting coil can be improved.

Additionally, according to the embodiment, since both the offset voltage and the feedback signal are superimposed on the excitation signal, as a result of setting an offset voltage corresponding to a magnetic field intensity due to a peripheral environment in the offset voltage adjuster 1018 in advance, it is possible to easily measure the magnetic field intensity of the subject of measurement with a high level of accuracy.

Second Embodiment

Next, a magnetic element control device 120 according to a second embodiment of the invention will be described with reference to FIG. 6.

Figure 6:
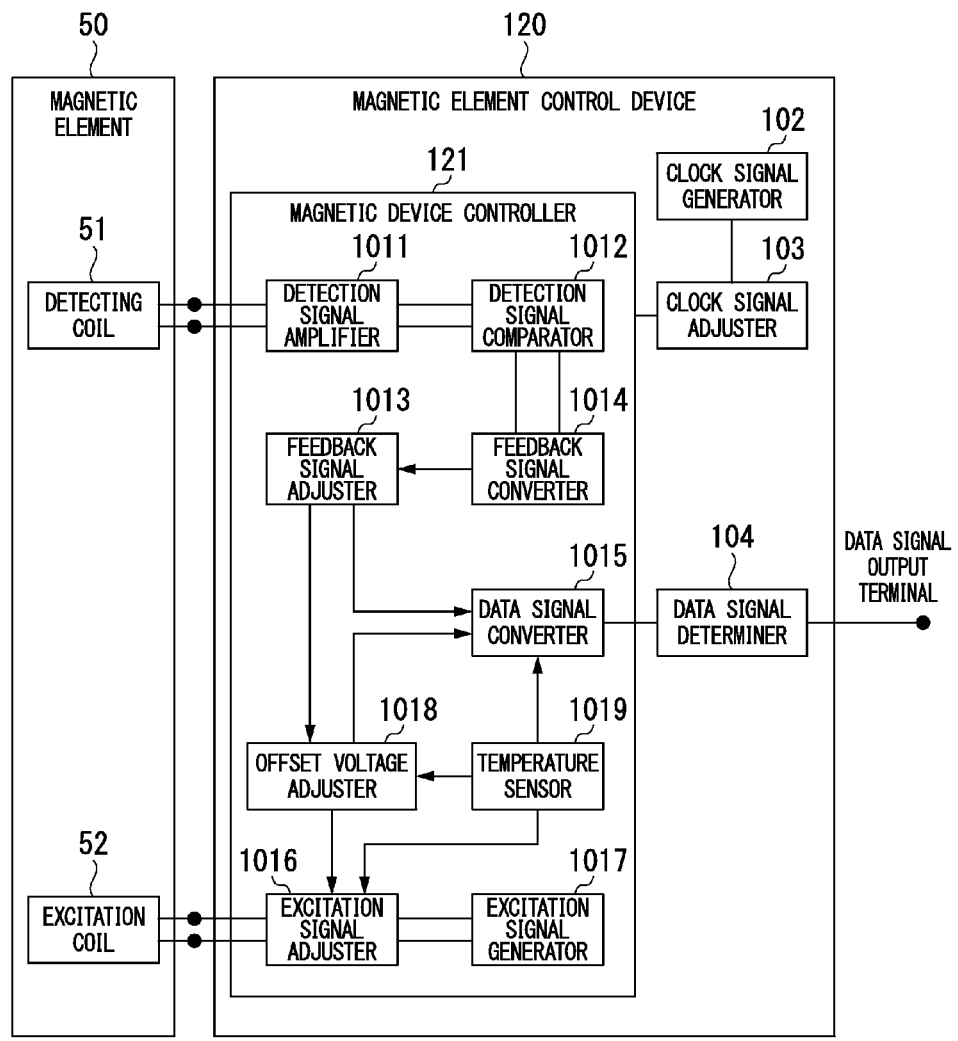
FIG. 6 is a view showing a configuration example of a magnetic element control device 120 according to a second embodiment.

FIG. 6 is a view showing a configuration example of a magnetic element control device 120 according to the second embodiment.

Identical reference numerals are used for the constitutions which are identical to those of the magnetic element control device 110 which is shown in FIG. 4 and described in the first embodiment of the invention.

In FIG. 6, the magnetic element control device 120 includes a magnetic device controller 121, the clock signal generator 102, the clock signal adjuster 103, and the data signal determiner 104.

The magnetic device controller 121 includes the detection signal amplifier 1011, the detection signal comparator 1012, the feedback signal adjuster 1013, the feedback signal converter 1014, the data signal converter 1015, the excitation signal adjuster 1016, the excitation signal generator 1017, the offset voltage adjuster 1018, and a temperature sensor 1019.

Hereinbelow, only differences from the constitution and the operation of the magnetic element control device 110 shown in FIG. 4 will be described.

The temperature sensor 1019 measures the temperature of the magnetic element 50, and outputs temperature data indicating the measured temperature to each of the data signal converter 1015, the offset voltage adjuster 1018, and the excitation signal adjuster 1016.

Consequently, an offset correction table that shows a correspondence relationship between a temperature and an offset correction coefficient by which an offset voltage is multiplied, is written in and stored in a storage unit inside the offset voltage adjuster 1018 in advance.

Next, the offset voltage adjuster 1018 reads out the offset correction coefficient corresponding to the temperature data supplied from the temperature sensor 1019.

Subsequently, the offset voltage adjuster 1018 multiplies the offset information read out from the storage unit provided thereinside by the offset correction coefficient, and generates an offset voltage corresponding to the result of multiplication indicated by offset information.

Furthermore, a voltage information correction table, that shows a correspondence relationship between a temperature and a voltage information correction coefficient used to correct an influence which is due to the temperature of the voltage information supplied from the feedback signal adjuster 1013, is written in and stored in a storage unit inside the data signal converter 1015 in advance.

Next, the data signal converter 1015 reads out, from the voltage information correction table, a voltage information correction coefficient corresponding to the temperature data supplied from the temperature sensor 1019.

The data signal converter 1015 multiplies the voltage information supplied from the feedback signal adjuster 1013 by the voltage information correction coefficient, and generates a data signal based on the voltage information representing the result of multiplication and the corrected offset information.

Moreover, a voltage value correction table, that shows a correspondence relationship between a temperature and a voltage value correction coefficient used to correct an influence which is due to the temperature caused by a voltage value of the excitation signal in which the feedback signal is superimposed on a triangular wave voltage signal, is written in and stored in a storage unit inside the excitation signal adjuster 1016 in advance.

Subsequently, the excitation signal adjuster 1016 reads out, from the voltage value correction table, the voltage value correction coefficient corresponding to the temperature data supplied from the temperature sensor 1019.

The excitation signal adjuster 1016 multiplies the voltage of the excitation signal generated by the excitation signal adjuster 1016 itself by the read-out voltage value correction coefficient, and applies the excitation signal representing the result of multiplication to the excitation coil 52.

Furthermore, a period correction table, that shows a correspondence relationship between a temperature and a period correction coefficient used to correct an influence which is due to the temperature caused by a period of the excitation signal, is written in and stored in a storage unit inside the excitation signal adjuster 1016 in advance.

Subsequently, the excitation signal adjuster 1016 reads out the period correction coefficient corresponding to the temperature data supplied from the temperature sensor 1019 from the period correction table.

The excitation signal adjuster 1016 corrects a period of the triangular wave supplied from the excitation signal generator 1017 by use of the read-out period correction coefficient, and generates a triangular wave voltage signal from the triangular wave obtained as the correction result.

Furthermore, in first embodiment and this embodiment which are described above, from the time which is on or before the process using the offset voltage adjuster 1018 is carried out to the time of carrying out the process using the offset voltage adjuster 1018, a computation processing using a digital value is carried out, that is, a constitution may be adopted in which voltage information indicating the digital value indicating the voltage value of the feedback signal, as the feedback signal is supplied from the feedback signal adjuster 1013 to the excitation signal adjuster 1016.

In this case, the excitation signal generator 1017 outputs a triangular wave as a digital value to the excitation signal adjuster 1016.

Additionally, the excitation signal adjuster 1016 may superimpose a feedback signal on the triangular wave voltage signal in synchronization with the clock signal output by the clock signal adjuster 103 and may generate an excitation signal by subjecting the resulting sum to D/A conversion.

Here, a period of generating a measuring period of an optionally-set (optionally-determined) duration in synchronization with a clock signal and of carrying out a measurement process by applying an excitation signal to the excitation coil 52 and a period of not carrying out the measurement process by not applying the excitation signal to the excitation coil 52 are alternately provided, and the excitation coil 52 is thereby subjected to intermittent operation.

Because of this, the magnetic element 50 itself is inhibited from being generated, the temperature change is reduced, and measurement of a magnetic field intensity is thereby carried out with a higher level of accuracy.

Additionally, as a result of sequentially driving the magnetic elements of a plurality of excitation coils using the above intermittent operation, a stationary magnetic field can be measured using a plurality of magnetic elements and one magnetic element control device.

As a result of providing magnetic elements so that, for example, three measurement axes of the magnetic elements, i.e., three axes including the x-axis, the y-axis, and the z-axis thereof are all orthogonal to each other, they can be used to control a magnetic element that is on the other axis and measures a magnetic field intensity and directions of magnetic fields in a three-dimensional space.

Additionally, in the second embodiment, temperature compensation with respect to the voltage information, the offset information, and the excitation signal is carried out as described above.

In the case where the temperature compensation with respect to the excitation signal in the excitation signal adjuster 1016 is not carried out, the resistance value of the excitation coil 52 varies due to the temperature change of the excitation coil 52, and the amount of current flowing therein due to the excitation signal.

Additionally, a period or a crest value of the excitation signal (for example, a crest value of a triangular wave voltage signal) may vary due to the temperature characteristics of a circuit constituting the excitation signal adjuster 1016.

Here, in the case of FB control, since temperature change detected by temperature measurement is sufficiently slower than the feedback time of one FB signal, the control does not substantially affect the convergence property when the FB signal that cancels the stationary magnetic field applied to the magnetic element 50 is generated.

However, as described above, an electrical current that flows in the excitation coil 52 by the excitation signal varies due to variations in the resistance value of the excitation coil 52 due to temperature change, and a magnetic sensitivity of the stationary magnetic field applied to the magnetic element 50 thereby varies.

Additionally, as a result of the temperature compensation by the data signal converter 1015, it is possible to correct the voltage information that corresponds to variation in a magnetic sensitivity and is determined from the duration of the detection signal output from the detecting coil 51 (the first detection signal and the second detection signal).

As a result, it is possible to realize the temperature dependency of the magnetic sensitivity that is equal to the excitation signal in the current control.

However, the difference Td to be measured may vary due to variations (for example, a width of a signal becomes wider or the like) in a signal waveform of the detection signal (the first detection signal and the second detection signal).

Consequently, in order to correct the duration to be measured, the temperature compensation with respect to the period of the excitation signal as described in the embodiment is effective to inhibit variations in the magnetic sensitivity.

In addition to the correction of the period of the excitation signal, correction of the offset voltage so as to correspond to the temperature change in the offset voltage adjuster 1018 as described in the embodiment is effective at compensating for the difference Td.

Third Embodiment

Next, a magnetic element control device 130 according to a third embodiment of the invention will be described with reference to FIG. 7.

Figure 7:
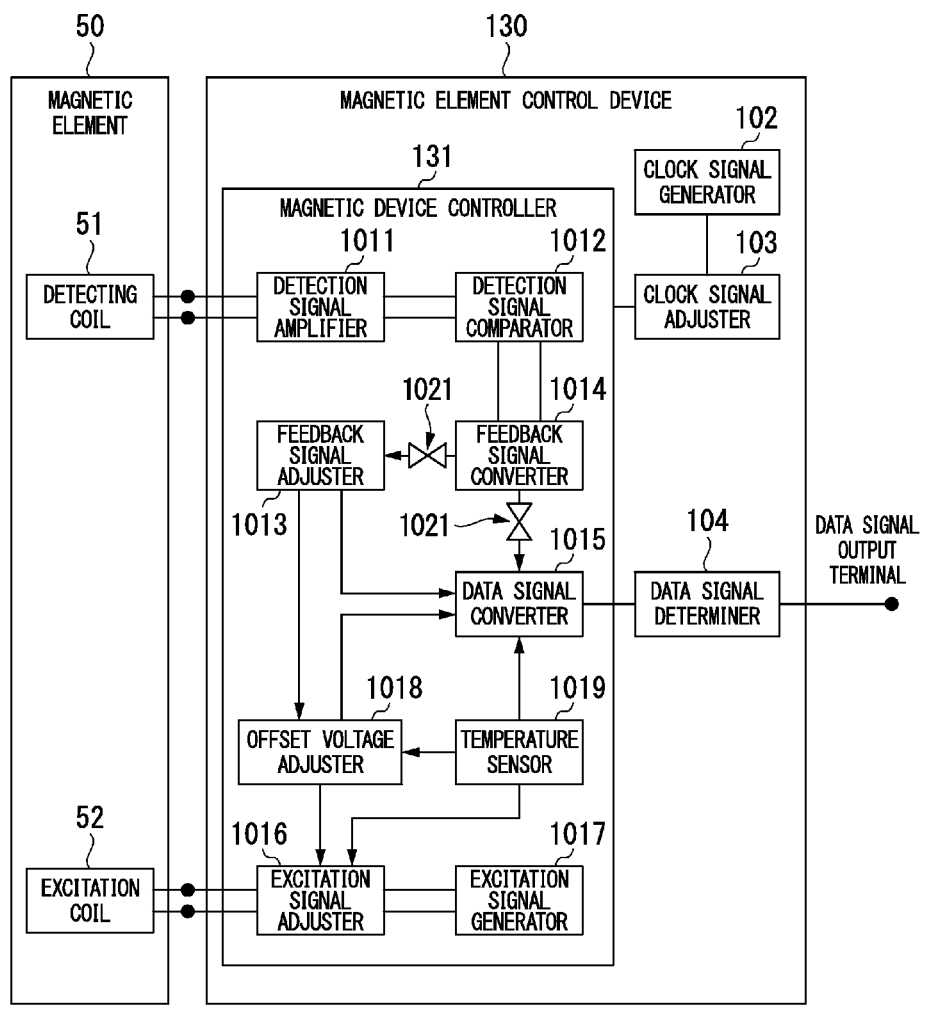
FIG. 7 is a view showing a configuration example of a magnetic element control device 130 according to a third embodiment.

FIG. 7 is a view showing a configuration example of a magnetic element control device 130 according to the third embodiment.

Identical reference numerals are used for the constitutions which are identical to those of the magnetic element control device 120 which is shown in FIG. 6 and described in the second embodiment of the invention.

In FIG. 7, the magnetic element control device 130 includes a magnetic device controller 131, the clock signal generator 102, the clock signal adjuster 103, and the data signal determiner 104.

The magnetic device controller 131 includes the detection signal amplifier 1011, the detection signal comparator 1012, the feedback signal adjuster 1013, the feedback signal converter 1014, the data signal converter 1015, the excitation signal adjuster 1016, the excitation signal generator 1017, the offset voltage adjuster 1018, the temperature sensor 1019, a first analog switch 1020, and a second analog switch 1021.

Hereinbelow, only differences from the constitution and the operation of the magnetic element control device 120 shown in FIG. 6 will be described.

The constitution of the third embodiment is different from that of the second embodiment in that the third embodiment can be used in both measurement of a magnetic field in a magnetic balance system and measurement of a magnetic field in a magnetic proportion system.

This means that, a user can optionally switch from the constitution of the second embodiment which measures a magnetic field by use of a magnetic balance system to the constitution of the third embodiment which measures a magnetic field by use of a magnetic proportion system.

Hereinbelow, the case of carrying out a process generating a feedback voltage using a digital value will be described; however, the case of generation of a feedback voltage using an analog processing is carried out in a similar manner.

In FIG. 7, each of the first analog switch 1020 and the second analog switch switches between a constitution using a magnetic balance system and a constitution using a magnetic proportion system.

Particularly, when the magnetic device controller 131 detects that a changing-over switch (not shown in the figure) of the magnetic element control device 130 is in a control state using a magnetic balance system, the magnetic device controller causes the first analog switch 1020 to be in an electroconductive state (ON) and causes the second analog switch 1021 to be in a non-electroconductive state (OFF).

Accordingly, in the feedback signal converter 1014, the difference Td indicating time is output to the feedback signal adjuster 1013, and the process of measuring a magnetic field in a manner similar to that of the second embodiment is carried out.

On the other hand, when the magnetic device controller 131 detects that the changing-over switch of the magnetic element control device 130 which is not shown in the figure is in a control state using a magnetic proportion system, the magnetic device controller causes the first analog switch 1020 to be in a non-electroconductive state (OFF) and causes the second analog switch 1021 to be in an electroconductive state (ON).

Consequently, the feedback signal converter 1014 determines the voltage information which corresponds to the difference Td and indicates time, and then outputs the voltage information to the data signal converter 1015 without outputting it to the feedback signal adjuster 1013.

Subsequently, in the case where the aforementioned changing-over switch represents the control state using the magnetic proportion system, the feedback signal converter 1014 outputs a voltage value indicating a magnetic field intensity based on the difference Td supplied from a feedback signal comparator 1012.

Here, a magnetic proportion system voltage table that shows a correspondence relationship between the difference Td and a voltage value indicating a magnetic intensity corresponding to the difference Td, is written in and stored in a storage unit inside the feedback signal converter 1014 in advance.

Additionally, the feedback signal conversion circuit 1014 reads out, from the magnetic proportion system voltage table, a voltage value corresponding to the difference Td supplied from the detection signal comparator 1012, amplifies the voltage value by the set amplification rate corresponding to the case of the magnetic proportion system, and outputs it to the data signal determiner 104.

Similar to the amplification rate used in the case of the magnetic proportion system, the amplification rate used in the case of the magnetic proportion system is also set to a value serving as a limiter that is used to extract the region in which a voltage value is linearly related to a magnetic intensity.

Therefore, in the case of the constitution using the magnetic balance system, the feedback signal conversion circuit 1014 amplifies the voltage information supplied from the feedback signal adjuster 1013 by the set amplification rate corresponding to the case of the magnetic balance system, and outputs it as the voltage value of the data signal to the data signal determiner 104.

Similar to the case of the magnetic balance system, also in the case of the magnetic proportion system, the data signal determiner 104 determines whether or not it is in the range in which the preset linear relation is maintained.

Next, a magnetic element control process of the magnetic element control device 130 according to the third embodiment will be described with reference to FIGS. 7 and 8.

Figure 8:
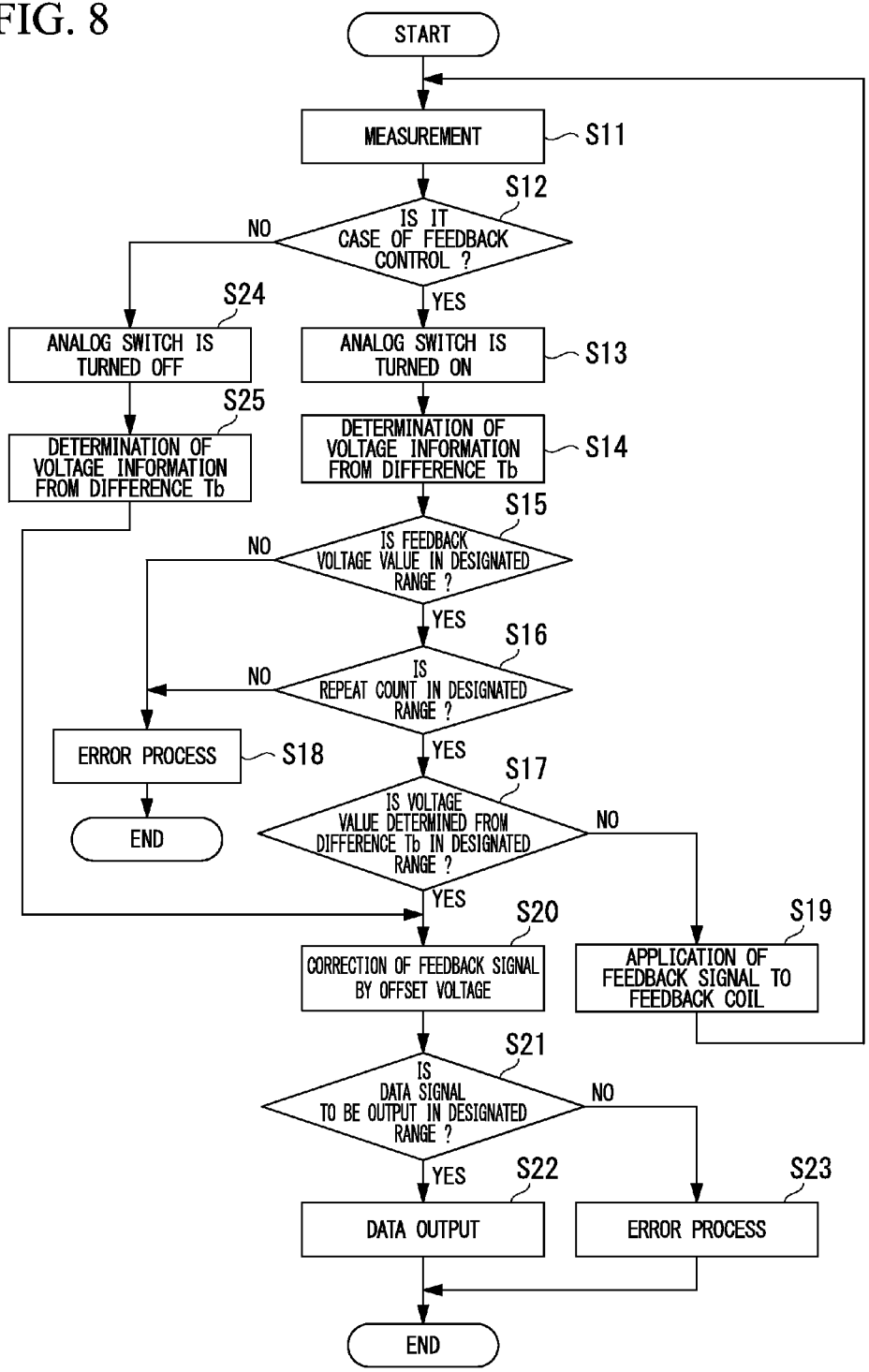
FIG. 8 is a flowchart showing an example of operating magnetic element control process (process of generating a voltage of a feedback signal by a digital value) that is performed by the magnetic element control device 130 according to the third embodiment.

FIG. 8 is a flowchart showing an example of operating magnetic element control process (process of generating a feedback voltage by a digital value) that is performed by the magnetic element control device 130 according to the third embodiment.

Step S11:

The detection signal amplifier 1011 amplifies a voltage between both ends of the detecting coil 51, and outputs it to the detection signal comparator 1012.

The detection signal comparator 1012 subtracts T/2 that is a reference duration from the duration Tw between the time point t1 at which the first detection signal is detected and the time point t2 at which the second detection signal is detected, and outputs the difference Td which is the result of subtraction as the measured time information to the feedback signal converter 1014.

Step S12:

The magnetic device controller 131 determines whether the changing-over switch is in a feedback control state (magnetic balance system mode) indicating that the magnetic element control device 130 is used as the constitution of the magnetic balance system or in a state (magnetic proportion system mode) indicating that the feedback control is not used which indicates that the magnetic element control device 130 is used as the constitution of the magnetic proportion system.

Here, in the case where the changing-over switch is in the magnetic balance system mode, the magnetic device controller 131 causes the process to proceed to Step S13. On the other hand, in the case where the changing-over switch is in the magnetic proportion system mode, the process proceeds to Step S23.

Step S13:

Next, in the case where the changing-over switch is in the magnetic balance mode, the magnetic device controller 131 causes the first analog switch 1020 to be in an electroconductive state and causes the second analog switch 1021 to be in a non-electroconductive state.

Accordingly, the feedback signal converter 1014 determines a voltage value corresponding to the difference Td from the difference Td supplied from the detection signal comparator 1012, and outputs the determined voltage value as voltage information to the feedback signal adjuster 1013.

The process of determining a voltage value from the difference Td is similar to the first embodiment and the second embodiment.

Step S14:

Subsequently, the feedback signal converter 1014 determines a voltage value corresponding to the difference Td from the difference Td supplied from the detection signal comparator 1012, and outputs the voltage value as voltage information to the feedback signal adjuster 1013.

After the voltage information is supplied to the feedback signal adjuster 1013, the feedback signal adjuster adds the voltage value indicating the voltage information to the voltage value of the last-minute feedback voltage that is written in the storage unit of the feedback signal adjuster 1013 itself, and defines the resulting sum as the voltage value of a new feedback voltage.

Step S15:

Next, the feedback signal adjuster 1013 determines whether or not the voltage value of the new feedback voltage which is the resulting sum is less than or equal to a preset maximum voltage (within a designated range).

The maximum voltage represents a first voltage threshold range (a voltage value range having a positive and a negative polarity) defining the voltage value range of the feedback voltage to be applied to the excitation coil 52, and is set to a voltage that is, for example, approximately 90% of the voltage value of the absolute maximum rating at which an excitation coil breaks when power is applied thereto.

At this time, in the case where the voltage is included in the first voltage threshold range, the feedback signal adjuster 1013 causes the process to proceed to Step S16. In the case where the voltage is not included in the first voltage threshold range, the process proceeds to Step S18.

Furthermore, in the case where it is determined that the feedback voltage is included in the first voltage threshold range, the feedback signal adjuster 1013 carries out a counting process using a counter provided thereinside, that is, increments a count value (adds 1 to the count value).

Step S16:

Subsequently, the feedback signal adjuster 1013 determines whether or not the count value of the counter provided thereinside is less than the count threshold value that is preliminarily written in and stored in the inside storage unit (set in the inside storage unit).

At this time, in the case where the count value of the counter is less than the count threshold value, the feedback signal adjuster 1013 causes the process to proceed to Step S17. On the other hand, in the case where the count value is greater than or equal to the count threshold value, the process proceeds to Step S18.

The aforementioned count threshold value is a value set in consideration of the case where the value is not converged when a feedback voltage is determined.

Accordingly, the count threshold value is a value at which a magnetic field intensity of the stationary magnetic field can be measured in an error range by applying a constant stationary magnetic field to the magnetic element 50, that is, a value that is used to determine the repeat count of calculation of the feedback voltage which means that the feedback voltage that cancels a stationary magnetic field can be calculated.

Subsequently, based on the repeat count, a numerical value that is obtained by multiplying the repeat count by, for example, an optionally-set (determined) multiple (optionally-set (determined) numerical value such as two) is preliminarily written in and stored in the storage unit inside the feedback signal adjuster 1013 as a count threshold value.

Step S17:

Next, the feedback signal adjuster 1013 determines whether or not the absolute value of the voltage value of the voltage information determined from the difference Td is less than a preset second voltage threshold value.

At this time, in the case where the voltage value of the voltage information determined from the difference Td is greater than or equal to the second voltage threshold value, the feedback signal adjuster 1013 causes the process to proceed to Step S20. On the other hand, in the case where the voltage value of the voltage information is less than the second threshold value, the process proceeds to Step S19.

Here, the second voltage threshold range is a range used to determine whether or not the voltage value changes a magnetic field intensity that exceeds a measurement error even in the case of adding the voltage value to the current feedback voltage.

Accordingly, the feedback signal adjuster 1013 determines the voltage value included in the second voltage threshold range as the voltage value that causes the magnetic field intensity to vary only within an error range in measurement, and does not carry out a process of adding the voltage value indicating the voltage information to the feedback voltage integrated in the inside storage unit.

Moreover, the second voltage threshold range is determined by experiment or the like and is written in and stored in the storage unit inside the feedback signal adjuster 1013 in advance.

Step S18:

Since the stationary magnetic field that is currently applied to the magnetic element 50 cannot be measured, the feedback signal adjuster 1013 outputs an error signal to an external magnetic-field-intensity detecting device through the data signal determiner 104.

As a result of supplying the error signal to the magnetic-field-intensity detecting device, the device displays, on the display unit of the magnetic-field-intensity detecting device, information which shows that the stationary magnetic field currently applied to the magnetic element 50 cannot be measured.

Step S19:

Next, the feedback signal adjuster 1013 causes a newly-determined feedback voltage to be written in and stored in the inside storage unit as a last-minute feedback voltage.

Moreover, the feedback signal adjuster 1013 generates a voltage corresponding to the newly determined voltage value of the feedback voltage, and outputs it as the FB signal to the offset voltage adjuster 1018.

At this time, in the case where the voltage value of the feedback voltage is not determined, the feedback signal adjuster 1013 continuously outputs the last-minute voltage value of the feedback voltage to the offset voltage adjuster 1018.

Next, the offset voltage adjuster 1018 generates an offset voltage of the voltage value of the offset information stored in the storage unit provided thereinside.

Furthermore, the offset voltage adjuster 1018 superimposes the generated offset voltage on the FB signal supplied from the feedback signal adjuster 1013, and outputs the result of superposition as a new FB signal to the excitation signal adjuster 1016.

Consequently, the excitation signal adjuster 1016 generates a triangular wave voltage signal from a triangular wave supplied from the excitation signal generator 1017.

The excitation signal adjuster 1016 superimposes the FB signal supplied from the offset voltage adjuster 1018 on the generated triangular wave voltage signal, generates an excitation signal, and applies it to the excitation coil 52.

After that, the excitation signal adjuster 1016 returns the process to Step S11.

Step S20:

Subsequently, the feedback signal adjuster 1013 reads out the voltage value of the feedback voltage stored in the storage unit provided thereinside, and outputs it to the data signal converter 1015.

In addition, the offset voltage adjuster 1018 outputs the offset information stored in the storage unit provided thereinside to the data signal converter 1015.

Next, the data signal converter 1015 subtracts the voltage value of the offset information supplied from the offset voltage adjuster 1018 from the voltage value of the feedback voltage supplied from the feedback signal adjuster 1013, amplifies the voltage value which is the result of subtraction by the preset amplification rate, and outputs it as a data signal to a data signal determiner.

Step S21:

After that, the data signal determiner 104 carries out determination whether or not the voltage value that is represented by the data signal and is supplied from the data signal converter 1015 is included in the data range stored in the storage unit provided thereinside.

At this time, in the case where the voltage value represented by the data signal is included in the data range, the data signal determiner 104 causes the process to proceed to Step S22.

On the other hand, in the case where the voltage value represented by the data signal is not included in the data range, the data signal determiner 104 causes the process to proceed to Step S23.

Step S22:

Next, the data signal determiner 104 outputs the data signal supplied from the data signal converter 1015 to an external magnetic field detection device.

As described above, the magnetic field detection device reads out, from the magnetic field intensity table stored in the storage unit provided thereinside, the magnetic field intensity corresponding to the voltage value represented by the data signal supplied from the magnetic element control device 130, and displays it on the display unit of the magnetic field detection device.

Step S23:

Subsequently, the data signal determiner 104 discards the data signal supplied from the data signal converter 1015, and outputs an error signal to an external magnetic field detection device.

As described above, when the error signal is supplied from the magnetic element control device 130 to the magnetic field detection device, the magnetic field detection device displays, on the display unit of the magnetic field detection device, information which shows that the applied stationary magnetic field cannot be measured.

Step S24:

After that, in the case where the changing-over switch is in a magnetic proportion mode, the magnetic device controller 131 causes the first analog switch 1020 to be in a non-electroconductive state and causes the second analog switch 1021 to be in an electroconductive state.

Accordingly, since the feedback signal converter 1014 is configured so that the above-mentioned changing-over switch is under a control using the magnetic proportion system, the feedback signal converter outputs the voltage value indicating a magnetic field intensity based on the difference Td supplied from the detection signal comparator 1012 to the data signal converter 1015.

Step S25:

Next, the feedback signal converter 1014 determines a voltage value indicating a magnetic field intensity based on the difference Td supplied from the detection signal comparator 1012, and outputs the determined voltage value to the data signal converter 1015.

Detection of the magnetic field intensity using the magnetic proportion is the same as that in the case of a conventional example described above.

Subsequently, the other magnetic element control process of the magnetic element control device 130 according to the third embodiment will be described with reference to FIGS. 7 and 9.

Figure 9:
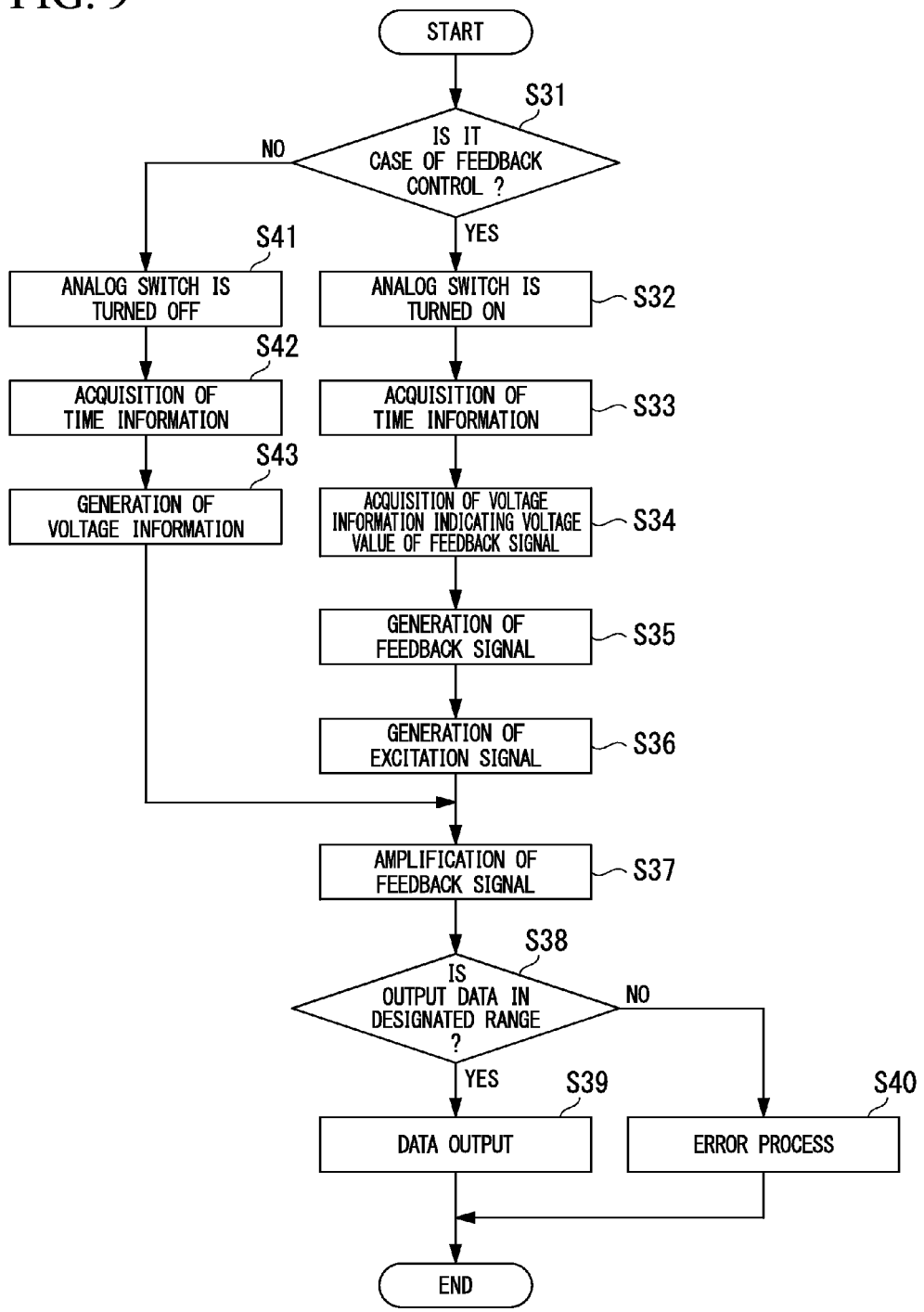
FIG. 9 is a flowchart showing an example of operating magnetic element control process (process of generating a voltage of a feedback signal by an analog value) that is performed by the magnetic element control device 130 according to the third embodiment.
Figure 10:
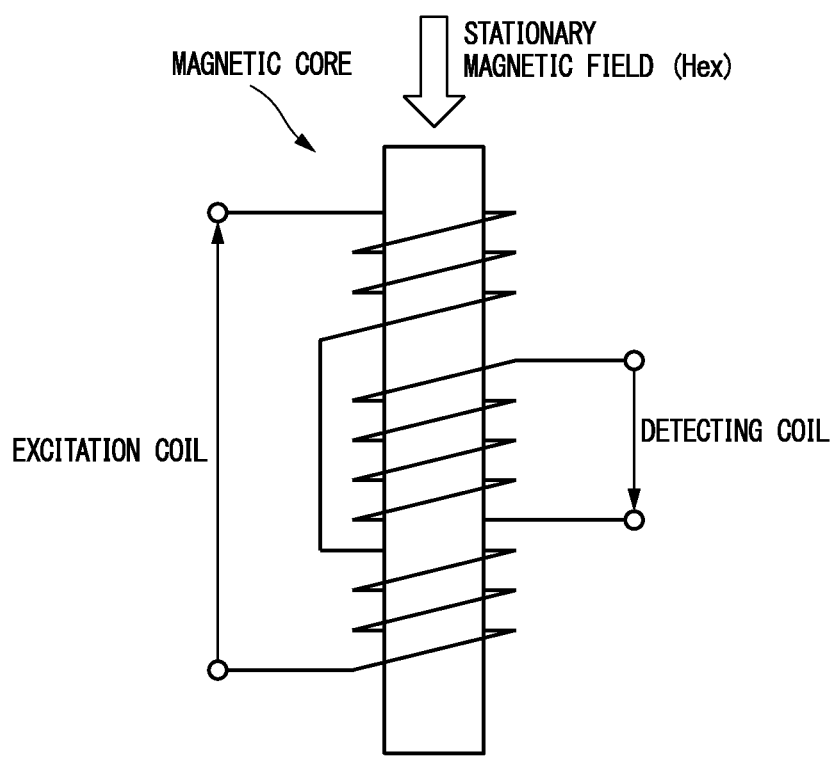
FIG. 10 is a view showing a configuration example of a magnetic element utilizing a time-resolved FG system (magnetic proportion measurement system).
Figure 11:
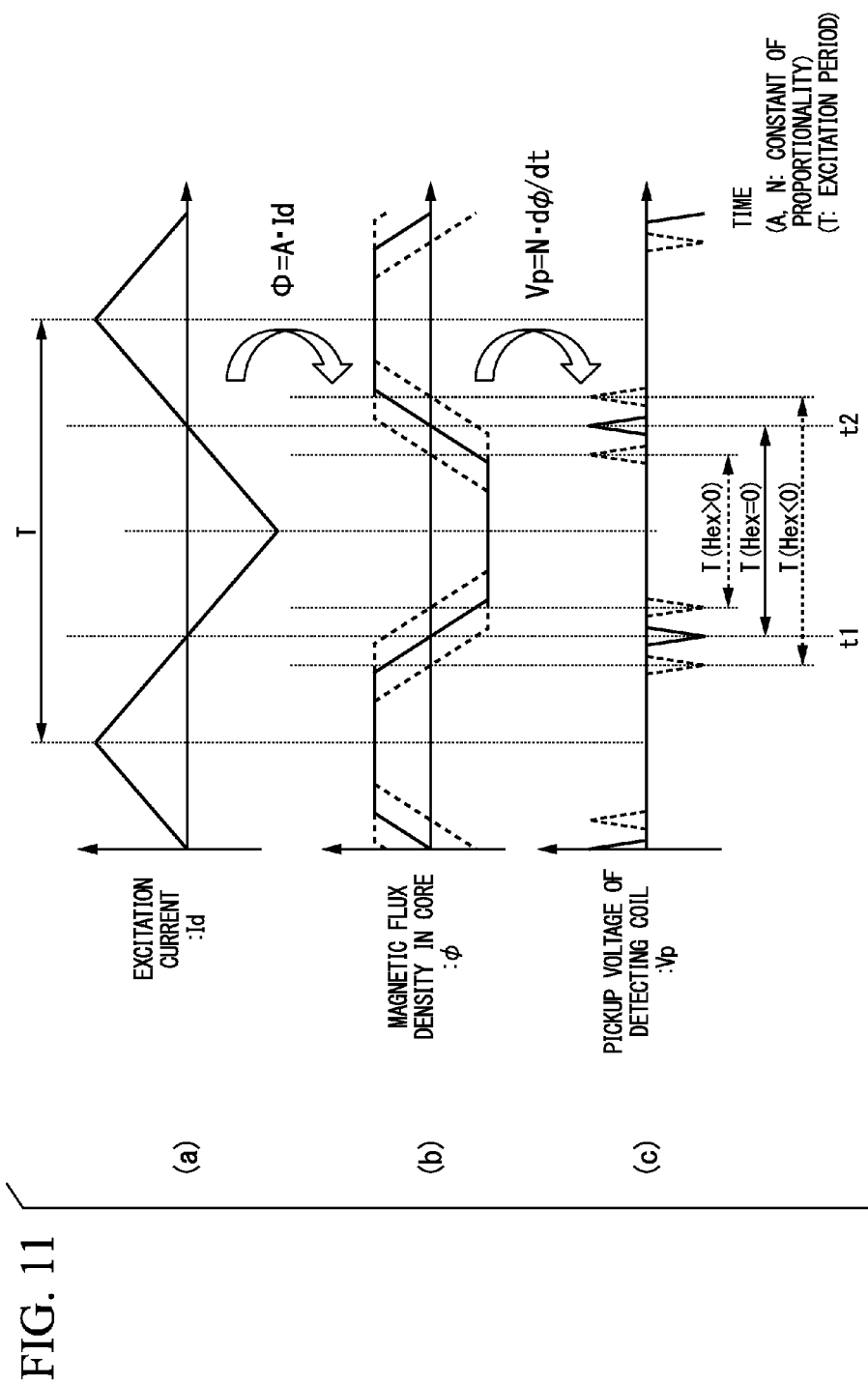
FIG. 11 is a waveform chart showing the principle of magnetic field detection in a magnetic proportion system by use of a magnetic element utilizing a time-resolved FG system.
Figure 12:
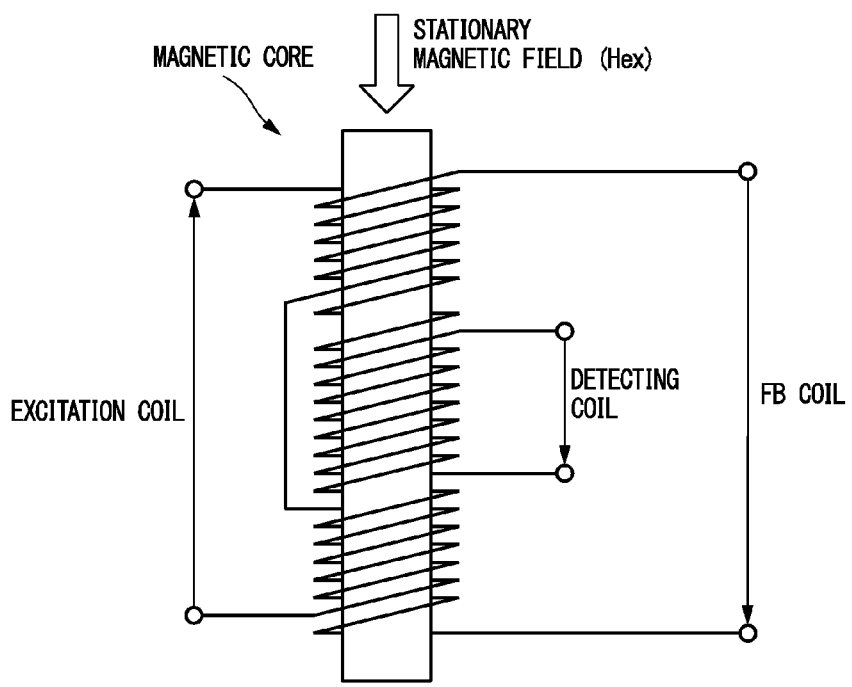
FIG. 12 is a view showing a configuration example of a magnetic element utilizing a time-resolved FG system (magnetic field balance measurement).
Figure 13:
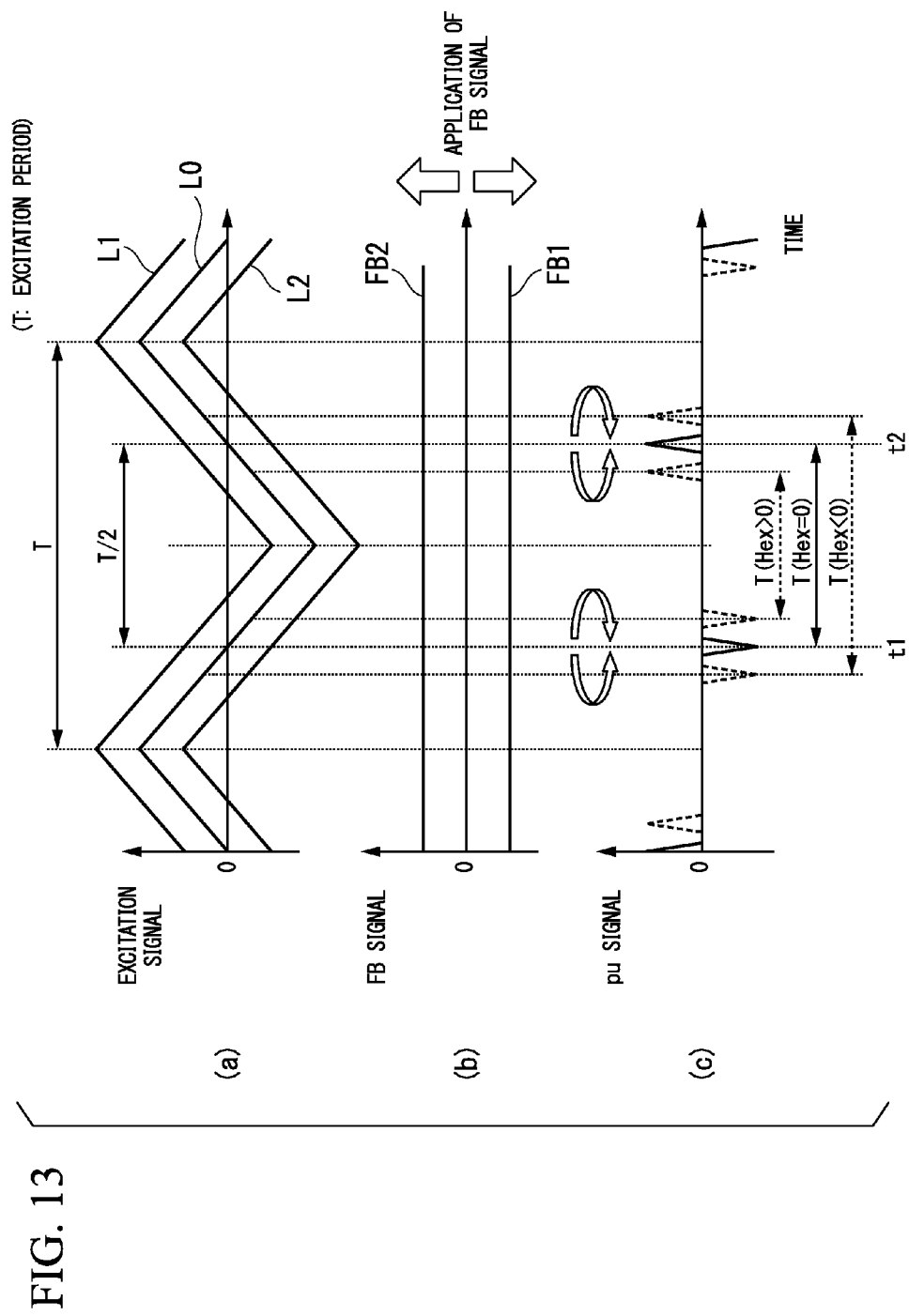
FIG. 13 is a waveform chart showing the principle of magnetic field detection in a magnetic field balance system by use of a magnetic element utilizing a time-resolved FG system.
Figure 14:
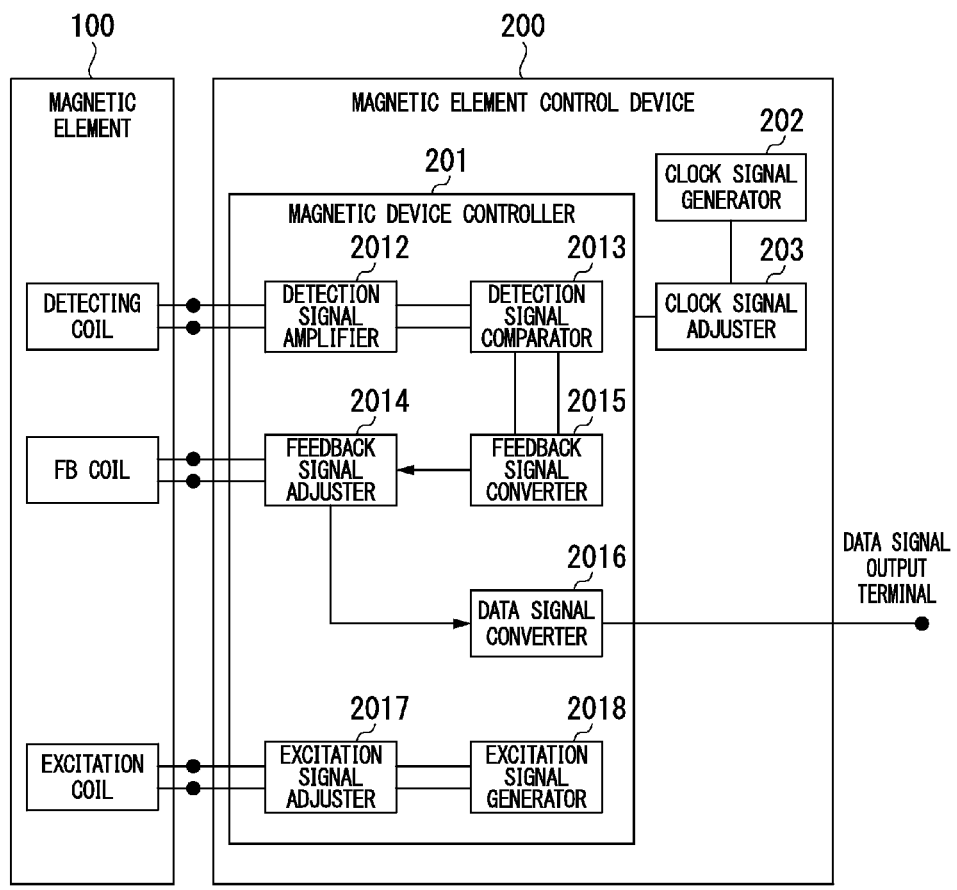
FIG. 14 is a block diagram showing a configuration example of a magnetic detecting device by use of a magnetic element control device utilizing FB control using an FB coil.

FIG. 9 is a flowchart showing an example of operating magnetic element control process (process of generating a feedback voltage by an analog value) that is performed by the magnetic element control device 130 according to the third embodiment.

Step S31:

The magnetic device controller 131 determines whether the changing-over switch is in a state (magnetic balance system mode) indicating that the magnetic element control device 130 is used as the constitution of the magnetic balance system or in a state (magnetic proportion system mode) indicating that the magnetic element control device 130 is used as the constitution of the magnetic proportion system.

Here, in the case where the changing-over switch is in the magnetic balance system mode, the magnetic device controller 131 causes the process to proceed to Step S32. On the other hand, in the case where the changing-over switch is in the magnetic proportion system mode, the process proceeds to Step S41.

Step S32:

Next, in the case where the changing-over switch is in the magnetic balance mode, the magnetic device controller 131 causes the first analog switch 1020 to be in an electroconductive state and causes the second analog switch 1021 to be in a non-electroconductive state.

Accordingly, the magnetic element control device 130 has a constitution that carries out detection of the magnetic field intensity using a magnetic balance system.

Step S33:

After that, the detection signal amplifier 1011 amplifies a voltage between both ends of the detecting coil 51 and outputs it to the detection signal comparator 1012.

Subsequently, the detection signal comparator 1012 outputs the detected first detection signal and the second detection signal as time information to the feedback signal converter 1014.

Step S34:

After the detection signal is supplied to the feedback signal converter 1014, based on the period (time information) at which based on the first detection signal and the second detection signal are output, the feedback signal converter generates a row of pulses (hereinbelow, refer to pulse row) having a duty ratio as voltage information and outputs the pulse row having the duty ratio as voltage information to the feedback signal adjuster 1013.

Step S35:

Based on the pulse row having the supplied duty ratio, the feedback signal adjuster 1013 generates a direct-current voltage by use of a PWM circuit or the like, and outputs it as the feedback signal to the offset voltage adjuster 1018.

Particularly, when a pulse that is voltage information is supplied, the feedback signal adjuster 1013 generates a feedback signal having the voltage value corresponding to the duty ratio of the pulse, and outputs the generated feedback signal to the offset voltage adjuster 1018.

Here, a current-voltage conversion circuit that is configured by use of, for example, an operational amplifier is provided in the feedback signal adjuster 1013.

In the current-voltage conversion circuit, an amplifier having a function of an operational amplifier is used, the amplifier functions so that a difference in electrical potentials between a positive input and a negative input is maintained to be zero, and therefore, a current signal which is from an output of the amplifier to a positive input is proportionally related to an external magnetic field.

Consequently, as a result of applying a signal, that is proportional to the current signal and serves as the feedback signal, to the excitation coil 52, a magnetic field is generated by the feedback signal, and a magnetic field that is applied to the magnetic core inside the magnetic element 50 is controlled so as to be constant.

As a result, the time interval between the first detection signal and the second detection signal can be maintained constant without relying on an external stationary magnetic field.

Step S36:

After that, the excitation signal adjuster 1016 superimposes the feedback signal supplied from the offset voltage adjuster 1018 on the triangular wave voltage signal generated from the triangular wave, generates an excitation signal, and applies it to the excitation coil 52.

Step S37:

Subsequently, the offset voltage adjuster 1018 outputs an offset voltage generated by a constant voltage source provided thereinside to the data signal converter 1015.

Consequently, the data signal converter 1015 subtracts the offset voltage supplied from the offset voltage adjuster 1018 from the feedback signal supplied from the feedback signal adjuster 1013, amplifies the voltage value which is the result of subtraction by the preset amplification rate, and outputs it as a data signal to a data signal determiner.

Step S38:

After that, the data signal determiner 104 carries out determination whether or not the voltage value that is represented by the data signal and is supplied from the data signal converter 1015 is included in the data range defined by two threshold voltages that are set in a determination circuit provided thereinside.

At this time, in the case where the voltage value represented by the data signal is included in the data range, the data signal determiner 104 causes the process to progress to Step S39.

On the other hand, in the case where the voltage value represented by the data signal is not included in the data range, the data signal determiner 104 causes the process to progress to Step S40.

Step S39:

Next, the data signal determiner 104 outputs the data signal supplied from the data signal converter 1015 to an external magnetic field detection device.

As described above, the magnetic field detection device converts a voltage of the data signal into a digital value by A/D conversion, reads out, from the magnetic field intensity table stored in the storage unit provided thereinside based on the converted digital value, the magnetic field intensity corresponding to the voltage value represented by the data signal supplied from the magnetic element control device 130, and displays it on the display unit of the magnetic field detection device.

Step S40:

Subsequently, the data signal determiner 104 discards the data signal supplied from the data signal converter 1015, and outputs an error signal to an external magnetic field detection device.

As described above, when the error signal is supplied from the magnetic element control device 130 to the magnetic field detection device, the magnetic field detection device displays, on the display unit of the magnetic field detection device, information which shows that the applied stationary magnetic field cannot be measured.

Step S41:

After that, in the case where the changing-over switch is in a magnetic proportion mode, the magnetic device controller 131 causes the first analog switch 1020 to be in a non-electroconductive state and causes the second analog switch 1021 to be in an electroconductive state.

Accordingly, since the feedback signal converter 1014 is configured so that the above-mentioned changing-over switch is under a control using the magnetic proportion system, the feedback signal converter outputs the voltage value indicating a magnetic field intensity based on the difference Td supplied from the detection signal comparator 1012 to the data signal converter 1015.

Step S42:

Subsequently, the detection signal amplifier 1011 amplifies a voltage between both ends of the detecting coil 51 and outputs it to the detection signal comparator 1012.

Next, the detection signal comparator 1012 outputs the detected first detection signal and the second detection signal as time information to the feedback signal converter 1014.

Step S43:

After the detection signal is supplied to the feedback signal converter 1014, based on the period (time information) at which based on the first detection signal and the second detection signal are output, the feedback signal converter generates a row of pulses (hereinbelow, refer to pulse row) having a duty ratio as voltage information and outputs the pulse row having the duty ratio as voltage information to the data signal converter 1015.

Based on the pulse row having the supplied duty ratio, the data signal converter 1015 generates a direct-current voltage as a measurement voltage by use of a PWM circuit or the like.

Next, the data signal converter 1015 subtracts the offset voltage supplied from the offset voltage adjuster 1018 from the generated measurement voltage, and defines the result of subtraction as a measurement voltage which is obtained by correcting the offset voltage.

In the subsequent Step S37, a measurement voltage is processed as the feedback signal.

According to the above-described third embodiment, by controlling an electroconductive state of each of the first analog switch 1020 and the second analog switch 1021, the magnetic element control device 130 can be used so that the constitution thereof is switched between measurement of a magnetic field by use of a magnetic balance system and measurement of a magnetic field by use of a magnetic proportion system.

In the third embodiment, as a result of providing a simple circuit, a constitution is realized which directly converts a voltage that cancels a stationary magnetic field into a magnetic field intensity as a measurement voltage without superimposing the feedback signal on the triangular wave voltage signal by setting the first analog switch 1020 in a non-electroconductive state, that is, without superimposing the feedback signal that cancels a stationary magnetic field applied to the magnetic element 50 on the excitation signal.

In the case of measurement of a magnetic field utilizing a magnetic proportion system, as a result of considering the measurement of a stationary magnetic field that is the subject of measurement, depending on a measurement range of a magnetic field limited by the excitation current and the excitation efficiency, an excellent linearity between a magnetic field and the measured measurement voltage is obtained.

Furthermore, when a stationary magnetic field within the measurement range of a magnetic field is measured by utilizing the magnetic proportion system, since it is not necessary to generate an FB signal, the amount of a consumption current can be reduced.

On the other hand, in the case where the measurement range of a magnetic field is wide, that is, in the case of measuring a magnetic field in the range having the magnetic field intensity higher than that of the measurement range of a magnetic field by use of the magnetic proportion system, it is necessary to measure a magnetic field by use of the magnetic balance system in a similar manner of the first embodiment and the second embodiment.

According to this magnetic balance system, a linearity between a magnetic field and a feedback signal can be obtained in a wider intensity range of a magnetic field.

Similar to the first embodiment and the second embodiment described above, until the process using the offset voltage adjuster 1018 is carried out after the process before carrying out the process using the offset voltage adjuster 1018, a computation processing using a digital value is carried out, that is, a constitution may be adopted in which voltage information indicating the digital value indicating the voltage value of the feedback signal, as the feedback signal is supplied from the feedback signal adjuster 1013 to the excitation signal adjuster 1016.

In this case, the excitation signal generator 1017 outputs a triangular wave as a digital value to the excitation signal adjuster 1016.

With this configuration, similar to the second embodiment, the excitation signal adjuster 1016 may superimpose a feedback signal on the triangular wave voltage signal in synchronization with the clock signal output by the clock signal adjuster 103 and may generate an excitation signal by subjecting the resulting sum to D/A conversion.

Here, a period of generating a measuring period of an optionally-set (optionally-determined) duration in synchronization with a clock signal and of carrying out a measurement process by applying an excitation signal to the excitation coil 52 and a period of not carrying out the measurement process by not applying the excitation signal to the excitation coil 52 are alternately provided, and the excitation coil 52 is thereby subjected to intermittent operation.

Because of this, the magnetic element 50 itself is inhibited from being generated, a temperature change is reduced, and measurement of a magnetic field intensity is thereby carried out with a higher level of accuracy.

Furthermore, similar to the second embodiment, as a result of sequentially driving the magnetic elements of a plurality of excitation coils by use of the above intermittent operation, a stationary magnetic field can be measured by use of a plurality of magnetic elements and by one magnetic element control device.

By providing magnetic elements so that, for example, three measurement axes of a magnetic element, i.e., three axes including the x-axis, the y-axis, and the z-axis are all orthogonal to each other, they can be used to control a magnetic element that is on the other axis and measures a magnetic field intensity and directions of magnetic fields in a three-dimensional space.

Additionally, a process of controlling a magnetic element may be carried out, by recording, in a computer readable storage medium, a program for realizing each of functions (arithmetic processing of generating a feedback signal by use of digital value) of the magnetic device controller 101 shown in FIG. 1, the magnetic device controller 111 shown in FIG. 4, the magnetic device controller 121 shown in FIG. 6, and the magnetic device controller 131 shown in FIG. 7, by causing a computer system to read out the program recorded in the recording medium, and executing the program.

Here, the computer system has hardware resources which may include an OS and peripheral devices.

The computer system also has a homepage service (or viewable) environment in the case where a WWW system is used.

The above computer readable storage medium is a storage device, for example, a portable medium such as a flexible disk, a magneto optical disk, a ROM, or a CD-ROM, or a memory device such as a hard disk built in a computer system.

Furthermore, the computer readable storage medium includes: a recording medium that dynamically maintains a program for a short period of time such as a communication line used in the case of transmitting a program through a communication line, such as, for example, a network such as the Internet or a telephone line; and a recording medium that maintains a program for a fixed period such as a volatile memory provided inside a computer system serving as a server or a client in this case.

Additionally, the above-mentioned program may be used to realize part of the above-mentioned function, and may be a program that can realize the above-mentioned function by combining it with the program recorded in a computer system in advance.

While embodiments of the invention have been described and shown above, specific constitutions is not limited to the embodiments, and embodiments thereof includes designs without departing from the scope of the invention.

What is claimed is:

1. A magnetic element control device of controlling a magnetic element during detection of an intensity of a stationary magnetic field by a time-resolved magnetic balance system where the magnetic field is applied to a flux-gate magnetic element that is constituted of an excitation coil and a detecting coil,
the device comprising:
   an excitation signal generator that generates an alternating signal;
   an excitation signal adjuster that generates an alternating voltage signal from the alternating signal and generates an excitation signal to be applied to the excitation coil based on the alternating voltage signal;
   a detection signal comparator that detects a detection signal of a positive voltage or a negative voltage which is generated by an induced electromotive force when an electrical current direction of the excitation signal is switched;
   a feedback signal converter that converts a duration between the detection signals of the positive voltage and the negative voltage into voltage information;
   a feedback signal adjuster that, based on the voltage information, generates a feedback signal for generating a magnetic field that cancels a stationary magnetic field that is applied to the magnetic element; and
   a data signal converter that outputs the feedback signal as a data signal indicating a magnetic field intensity, wherein
   the excitation signal adjuster superimposes the feedback signal on the alternating voltage signal and thereby generates the excitation signal, and applies the generated excitation signal to the excitation coil, and
   the data signal converter amplifies the feedback signal by a preset amplification rate and outputs the signal where a voltage value that is out of a voltage range of the feedback signal, in which a magnetic field intensity generated by a voltage value of the feedback signal and the voltage value of the feedback signal have a linearity, is saturated at the amplification rate.

2. The magnetic element control device according to claim 1, further comprising:
   an offset voltage adjuster that superimposes an offset voltage corresponding to a magnetic field which is due to an ambient environment for measurement of a stationary magnetic field on the feedback signal and outputs the feedback signal, on which the offset voltage is superimposed, to the excitation signal adjuster.

3. The magnetic element control device according to claim 1, further comprising:
   a temperature sensor that measures a temperature of the magnetic element, wherein
   the excitation signal adjuster corrects the alternating voltage signal by multiplying by a coefficient corresponding to the temperature, superimposes the feedback signal on the corrected alternating voltage signal, and supplies the superimposed alternating voltage signal serving as the excitation signal to the excitation coil.

4. The magnetic element control device according to claim 1, further comprising:
   a temperature sensor that measures a temperature of the magnetic element, wherein
   the excitation signal generator adjusts a period of the alternating signal so as to correspond to a coefficient corresponding to the temperature, superimposes the feedback signal on the adjusted alternating voltage signal, and supplies the superimposed alternating voltage signal serving as the excitation signal to the excitation coil.

5. The magnetic element control device according to claim 1, wherein
the feedback signal converter determines, from the duration, a duty ratio indicating a voltage value of the feedback signal as the voltage information, and outputs a rectangular wave having the duty ratio indicating the voltage value of the feedback signal to the feedback signal adjuster, and
the feedback signal adjuster generates the feedback signal that is a direct-current voltage based on the duty ratio of the rectangular wave.

6. The magnetic element control device according to claim 1, wherein
the feedback signal converter determines a difference between the duration and a preset reference duration, determines, from the difference, a digital value indicating a voltage value of the feedback signal as the voltage information, and outputs the digital value to the feedback signal adjuster, and
the feedback signal adjuster generates the feedback signal that is a direct-current voltage indicated by the digital value.

7. The magnetic element control device according to claim 1, wherein
when a mode of detecting an intensity of a magnetic field is selected by a time-resolved magnetic proportion system,
the feedback signal adjuster sets a voltage value of the feedback signal to be 0 V and supplies the voltage value to the excitation signal adjuster, and
the feedback signal converter outputs the duration as measurement data of the stationary magnetic field.

8. The magnetic element control device according to claim 1, further comprising:
a clock signal generator that generates a periodic clock signal, wherein
the excitation signal generator generates a triangular wave signal as the alternating signal that is synchronized with the clock signal.

9. A magnetic device control method of controlling a magnetic element during detection of an intensity of a stationary magnetic field by a time-resolved magnetic balance system where the magnetic field is applied to a flux-gate magnetic element that is constituted of an excitation coil and a detecting coil,
the method comprising:
an excitation signal generation step of generating an alternating signal;
an excitation signal adjustment step of generating an alternating voltage signal from the alternating signal and generating an excitation signal to be applied to the excitation coil based on the alternating voltage signal;
a detection signal comparison step of detecting a detection signal of a positive voltage or a negative voltage which is generated by an induced electromotive force when an electrical current direction of the excitation signal is switched;
a feedback signal conversion step of converting a duration between the detection signals of the positive voltage and the negative voltage into voltage information;
a feedback signal adjustment step of, based on the voltage information, generating a feedback signal for generating a magnetic field that cancels a stationary magnetic field that is applied to the magnetic element; and
a data signal conversion step of outputting the feedback signal as a data signal indicating a magnetic field intensity, wherein
in the excitation signal adjustment step, the feedback signal is superimposed on the alternating voltage signal and the excitation signal is thereby generated, and the generated excitation signal is applied to the excitation coil, and
in the data signal conversion step, the feedback signal is amplified by a preset amplification rate and the signal is outputted where a voltage value that is out of a voltage range of the feedback signal, in which a magnetic field intensity generated by a voltage value of the feedback signal and the voltage value of the feedback signal have a linearity, is saturated at the amplification rate.

10. A magnetic detecting device using a magnetic field balance system that detects an intensity of an applied stationary magnetic field,
the device comprising:
a flux-gate magnetic element that is constituted of an excitation coil and a detecting coil;
an excitation signal generator that generates an alternating signal;
an excitation signal adjuster that generates an alternating voltage signal from the alternating signal and generates an excitation signal to be applied to the excitation coil based on the alternating voltage signal;
a detection signal comparator that detects a detection signal of a positive voltage or a negative voltage which is generated by an induced electromotive force when an electrical current direction of the excitation signal is switched;
a feedback signal converter that converts a duration between the detection signals of the positive voltage and the negative voltage into voltage information;
a feedback signal adjuster that, based on the voltage information, generates a feedback signal for generating a magnetic field that cancels a stationary magnetic field that is applied to the magnetic element; and
a data signal converter that outputs the feedback signal as a data signal indicating a magnetic field intensity, wherein
the excitation signal adjuster superimposes the feedback signal on the alternating voltage signal and thereby generates the excitation signal, and applies the generated excitation signal to the excitation coil, and
the data signal converter amplifies the feedback signal by a preset amplification rate and outputs the signal where a voltage value that is out of a voltage range of the feedback signal, in which a magnetic field intensity generated by a voltage value of the feedback signal and the voltage value of the feedback signal have a linearity, is saturated at the amplification rate.

* * * * *